(12) United States Patent
Luo et al.

(10) Patent No.: US 11,985,823 B2
(45) Date of Patent: May 14, 2024

(54) MICROELECTRONIC DEVICES WITH SLIT STRUCTURES INCLUDING METAL PLUGS AND RELATED SYSTEMS

(71) Applicant: Micron Technology, Inc., Boise, ID (US)

(72) Inventors: Shuangqiang Luo, Boise, ID (US); Indra V. Chary, Boise, ID (US); Justin B. Dorhout, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 94 days.

(21) Appl. No.: 17/062,373

(22) Filed: Oct. 2, 2020

(65) Prior Publication Data

US 2022/0109001 A1 Apr. 7, 2022

(51) Int. Cl.
| | | |
|---|---|---|
| *H10B 43/27* | (2023.01) | |
| *H01L 21/768* | (2006.01) | |
| *H01L 23/00* | (2006.01) | |
| *H01L 23/532* | (2006.01) | |
| *H01L 23/535* | (2006.01) | |
| *H10B 41/27* | (2023.01) | |

(52) U.S. Cl.
CPC ....... *H10B 43/27* (2023.02); *H01L 21/76805* (2013.01); *H01L 21/76895* (2013.01); *H01L 23/53242* (2013.01); *H01L 23/535* (2013.01); *H01L 23/562* (2013.01); *H10B 41/27* (2023.02)

(58) Field of Classification Search
CPC ......... H01L 27/11582; H01L 27/11565; H01L 27/1157; H01L 23/5226; H01L 27/11575; H10B 43/27; H10B 43/10; H10B 41/27; H10B 43/50; H10B 43/35
See application file for complete search history.

(56) References Cited

U.S. PATENT DOCUMENTS

| | | | | |
|---|---|---|---|---|
| 2019/0333929 A1* | 10/2019 | Lee | ................. | H01L 27/1157 |
| 2019/0341399 A1* | 11/2019 | Tao | ................. | H01L 27/1157 |
| 2021/0225864 A1* | 7/2021 | Zhang | ................. | H01L 23/5226 |

* cited by examiner

*Primary Examiner* — Tony Tran
(74) *Attorney, Agent, or Firm* — TraskBritt

(57) ABSTRACT

A microelectronic device may include a stack structure comprising a vertically alternating sequence of insulative structures and conductive structures, the stack structure divided into block portions. The microelectronic device may additionally include slit structures horizontally interposed between the block portions of the stack structure. Each of the slit structures may include a dielectric liner covering side surfaces of the stack structure and an upper surface of an additional structure underlying the stack structure, and a plug structure comprising at least one metal surrounded by the dielectric liner.

9 Claims, 31 Drawing Sheets

MICROELECTRONIC DEVICES WITH SLIT STRUCTURES INCLUDING METAL PLUGS AND RELATED SYSTEMS

TECHNICAL FIELD

Embodiments of the disclosure relate to the field of microelectronic device design and fabrication. More particularly, the disclosure relates to methods for forming microelectronic devices (e.g., memory devices, such as 3D NAND memory devices) having tiered stack structures that include vertically alternating conductive structures and insulative structures, to related systems, and to methods for forming such structures and devices.

BACKGROUND

Memory devices provide data storage for electronic systems. A Flash memory device is one of various memory device types and has numerous uses in modern computers and other electrical devices. A conventional Flash memory device may include a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line).

In a "three-dimensional NAND" memory device (which may also be referred to herein as a "3D NAND" memory device), a type of vertical memory device, not only are the memory cells arranged in row and column fashion in a horizontal array, but tiers of the horizontal arrays are stacked over one another (e.g., as vertical strings of memory cells) to provide a "three-dimensional array" of the memory cells. The stack of tiers vertically alternate conductive materials with insulating (e.g., dielectric) materials. The conductive materials function as control gates for, e.g., access lines (e.g., word lines) of the memory cells. Vertical structures (e.g., pillars comprising channel structures and tunneling structures) extend along the vertical string of memory cells. A drain end of a string is adjacent one of the top and bottom of the vertical structure (e.g., pillar), while a source end of the string is adjacent the other of the top and bottom of the pillar. The drain end is operably connected to a bit line, while the source end is operably connected to a source line. A 3D NAND memory device also includes electrical connections between, e.g., access lines (e.g., word lines) and other conductive structures of the device so that the memory cells of the vertical strings can be selected for writing, reading, and erasing operations.

The density of 3D NAND memory devices may be increased by increasing the number of tiers in a stack. Having a large number of tiers in a stack, however, creates challenges in manufacturing. For example, slits formed in the stack to define separate blocks in the stack may have a relatively high aspect ratio (e.g., a large depth compared to a width) which may create difficulties in manufacturing and may result in defects.

DETAILED DESCRIPTION

Figure 1:
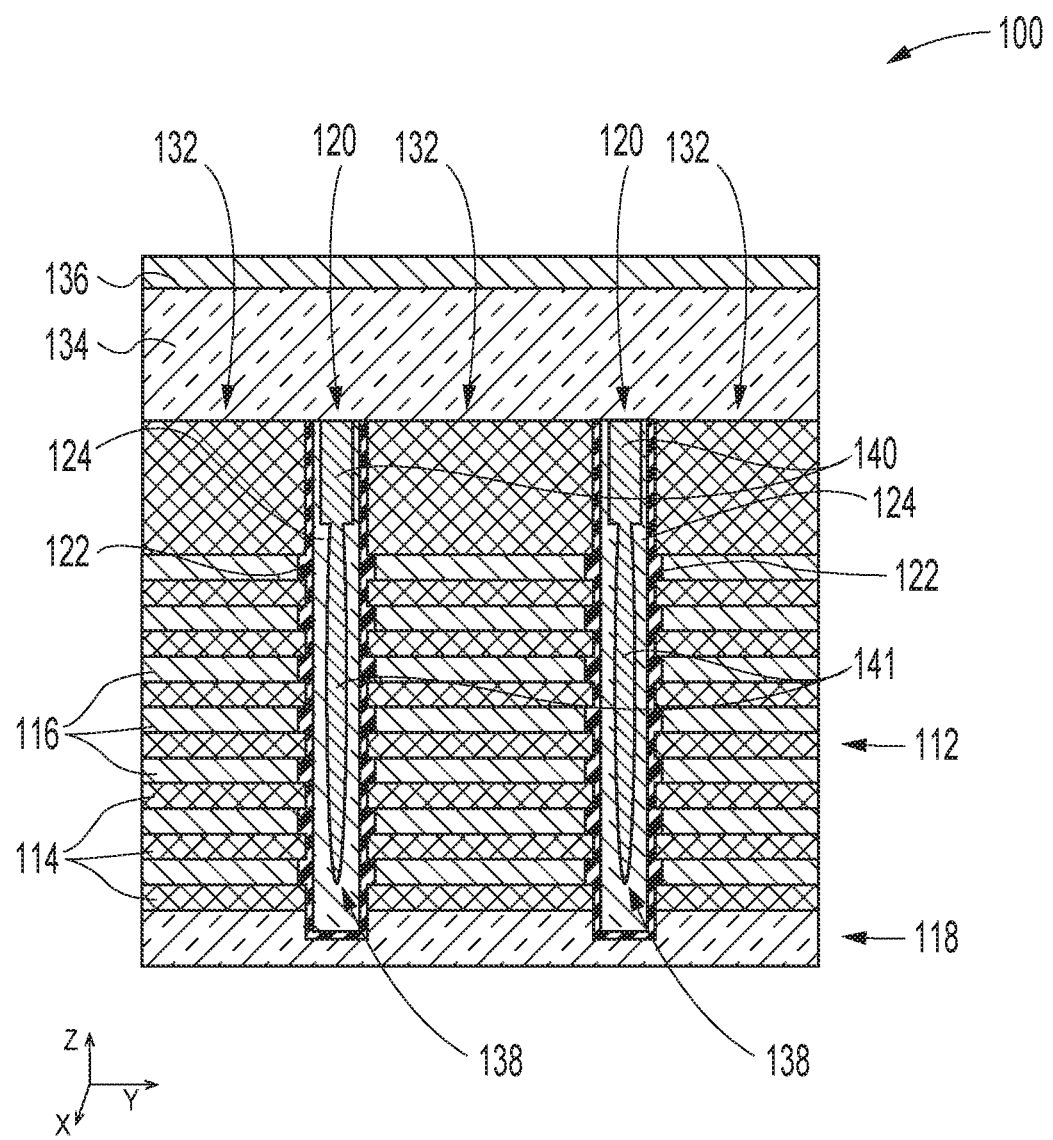
FIG. 1 is a cross-sectional, elevational, schematic illustration of a microelectronic device structure, according to embodiments of the disclosure, with slit structures including metal plugs.

Structures (e.g., microelectronic device structures), apparatus (e.g., microelectronic devices), and systems (e.g., electronic systems) according to embodiments of the disclosure, include a stack structure, with vertically alternating insulative structures and conductive structures. Below the stack structure, one or more additional structures (e.g., at least one base structures, at least one substrate, at least one base material) support the stack structure. For example, the stack structure may be arranged above a source structure. Slit structures include at least one dielectric liner (e.g., a dielectric oxide liner) and a fill material (e.g., a polysilicon fill material) may extend through the stack structure and into the source structure. The dielectric liner may electrically isolate the fill material of the slit structures from the source structure. The slit structures may divide the stack structure into block portions. The slit structures may have a relatively high aspect ratio (e.g., the ratio of vertical depth relative to horizontal width). In addition, the slit structures may further include metal structures (e.g., metal plugs) at ends thereof. For example, the metal plugs may be comprised of one or more of titanium, titanium nitride, and tungsten. Voids (e.g., openings, seams) within the fill material (e.g., resulting from due to the relatively high aspect ratio of the slit structures, etch bow, and/or the fill capability of the fill material) may also be filled (e.g., substantially filled) with metal, which may impede (e.g., prevent) cracks from developing within the slit structures. However, even if at least some voids within the fill material of at least one slit structure are not filled with metal and a crack forms within the slit structure, the crack may be prevented from propagating outside of a horizontal area of the slit structure by the metal plug positioned at an end of the slit structure. Accordingly, defects in microelectronic devices structures may be reduced by including metal plugs within the slit structures.

As used herein, the term "opening" means a volume extending through at least one structure or at least one material, leaving a gap in that at least one structure or at least one material, or a volume extending between structures or materials, leaving a gap between the structures or materials. Unless otherwise described, an "opening" is not necessarily empty of material. That is, an "opening" is not necessarily void space. An "opening" formed in or between structures or materials may comprise structure(s) or material(s) other than that in or between which the opening is formed. And, structure(s) or material(s) "exposed" within an opening is (are) not necessarily in contact with an atmosphere or non-solid environment. Structure(s) or material(s) "exposed" within an opening may be adjacent or in contact with other structure(s) or material(s) that is (are) disposed within the opening.

As used herein, the term "substrate" means and includes a base material or other construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, structures, or junctions in the base semiconductor structure or foundation.

As used herein, the term "insulative material" means and includes electrically insulative material. An insulative material may be formed of and include one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric carboxynitride material (e.g., a silicon carboxynitride ($SiO_xC_zN_y$)), and/or air. Formulae including one or more of "x," "y," and/or "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and/or "z" atoms of an additional element (if any), respectively, for every one atom of another element (e.g., Si, Al, Hf, Nb, Ti). As the formulae are representative of relative atomic ratios and not strict chemical structure, an insulative material or insulative structure may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, the term "sacrificial," when used in reference to a material or structure, means and includes a material or structure that is formed during a fabrication process but which is removed (e.g., substantially removed) prior to completion of the fabrication process.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, the term "width" means and includes a dimension, along a horizontal plane (e.g., at a certain elevation, if identified), defining a maximum distance, along such plane, of the material or structure in question. For example, a "width" of a structure, that is at least partially hollow, is the horizontal dimension between outermost edges or sidewalls of the structure, such as an outer diameter for a hollow, cylindrical structure.

As used herein, the terms "thickness" or "thinness" mean and include a dimension in a straight-line direction that is normal to the closest surface of an immediately adjacent material or structure that is of a different composition or that is otherwise distinguishable from the material or structure whose thickness, thinness, or height is discussed.

As used herein, the term "between" is a spatially relative term used to describe the relative disposition of one material, structure, or sub-structure relative to at least two other materials, structures, or sub-structures. The term "between" may encompass both a disposition of one material, structure, or sub-structure directly adjacent the other materials, structures, or sub-structures and a disposition of one material, structure, or sub-structure indirectly adjacent to the other materials, structures, or sub-structures.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0% met, at least 95.0% met, at least 99.0% met, or even at least 99.9% met.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "level" and "elevation" are spatially relative terms used to describe one material's or feature's relationship to another material(s) or feature(s) as illustrated in the figures, using—as a reference point—the primary surface of the substrate on which the reference material or structure is located. As used herein, a "level" and an "elevation" are each defined by a horizontal plane parallel to the primary surface. "Lower levels" and "lower elevations" are nearer to the primary surface of the substrate, while "higher levels" and "higher elevations" are further from the primary surface. Unless otherwise specified, these spatially relative terms are intended to encompass different orientations of the materials in addition to the orientation as depicted in the figures. For example, the materials in the figures may be inverted, rotated, etc., with the spatially relative "elevation" descriptors remaining constant because the referenced primary surface would likewise be respectively reoriented as well.

As used herein, the terms "comprising," "including," "having," and grammatical equivalents thereof are inclusive or open-ended terms that do not exclude additional, unrecited elements or method steps, but these terms also include more restrictive terms "consisting of" and "consisting essentially of" and grammatical equivalents thereof. Therefore, a structure described as "comprising," "including," and/or "having" a material may be a structure that, in some embodiments, includes additional material(s) as well and/or a structure that, in some embodiments, does not include any other material(s). Likewise, a composition (e.g., gas) described as "comprising," "including," and/or "having" a species may be a composition that, in some embodiments, includes additional species as well and/or a composition that, in some embodiments, does not include any other species.

As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features, and methods usable in combination therewith should or must be excluded.

As used herein, "and/or" includes any and all combinations of one or more of the associated listed items.

As used herein, the singular forms "a," "an," and "the" are intended to include the plural forms as well, unless the context clearly indicates otherwise.

As used herein, the terms "configured" and "configuration" mean and refer to a size, shape, material composition, orientation, and arrangement of a referenced material, structure, assembly, or apparatus so as to facilitate a referenced operation or property of the referenced material, structure, assembly, or apparatus in a predetermined way.

The illustrations presented herein are not meant to be actual views of any particular material, structure, substructure, region, sub-region, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or structures as illustrated but may include deviations in shapes that result, for example, from manufacturing techniques. For example, a structure illustrated or described as box-shaped may have rough and/or nonlinear features. Moreover, sharp angles that are illustrated may be rounded. Thus, the materials, features, and structures illustrated in the figures are schematic in nature and their shapes are not intended to illustrate the precise shape of a material, feature, or structure and do not limit the scope of the present claims.

The following description provides specific details, such as material types and processing conditions, in order to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, or other known methods.

In referring to the drawings, like numerals refer to like components throughout. The drawings are not necessarily drawn to scale.

FIG. 1 illustrates a cross-sectional view of a microelectronic device structure 100 (e.g., a memory device structure, such as a 3D NAND memory device structure) according to embodiments of the disclosure, for an apparatus (e.g., a memory device, such as a 3D NAND memory device), which may be included in a system. The microelectronic device structure 100 includes a stack structure 112, with vertically alternating insulative structures 114, comprising insulative material (e.g., dielectric oxide, such as silicon oxide), and conductive structures 116 comprising conductive material (e.g., metal, such as tungsten (W); conductively doped semiconductive material, such as conductively doped polysilicon).

Below the stack structure 112, one or more substrate or other base materials, support the stack structure 112. For example, the stack structure 112 may be arranged above a source structure 118, which may comprise polysilicon material.

Slit structures 120 which may comprise at least one dielectric liner, such as a dielectric oxide liner 122, and may be at least partially filled with a fill material, such as a polysilicon fill material 124, may extend through the stack structure 112 and into the source structure 118. The dielectric oxide liner 122 may electrically isolate the polysilicon fill material 124 of the slit structures 120 from the source structure 118. The slit structures 120 may extend similarly to an elongated trench and divide the stack structure 112 into block portions 132.

Additional structures, such as an insulative structure 134 (e.g., an oxide structure) and bit lines 136 may overly the stack structure 112 and slit structures 120.

The slit structures 120 may have a relatively high aspect ratio (e.g., the ratio of a depth relative to a width). In some embodiments, the slit structures 120 may have an aspect ratio greater than 40:1. In further embodiments, the slit structures 120 may have an aspect ratio greater than 50:1. In yet further embodiments, the slit structures 120 may have an aspect ratio greater than 60:1. The polysilicon fill material 124 formed in the slit structures 120 may include voids 138 (e.g., openings and/or seams), due to the relatively high aspect ratio of the slit structures 120, etch bow, and the fill capability of the polysilicon fill material 124.

The slit structures 120 may individually further include a metal structure 140 (e.g., a metal plug) at an upper vertical end (e.g., in the Z-direction) thereof. For example, the metal structure 140 may be formed of and include one or more of titanium, titanium nitride, and tungsten. In addition, optionally, voids 138 (e.g., openings, seams) within the fill material 124 may also be filled (e.g., substantially filled) with additional metal structures 141. The metal structures 140 may be integral and continuous with the additional metal structures 141 (if any). The metal structures 140 and the additional metal structures 141 (if any) may help prevent cracks from developing within the slit structures 120. However, even if one or more of the voids 138 within the fill material 124 are not filled with one of the additional metal structures 141 and a crack forms within a slit structure 120, the crack may be prevented from propagating outside of the slit structure 120 by the metal structure 140 positioned at the upper vertical end of the slit structure 120.

The polysilicon fill material 124 and dielectric oxide liner 122 of the slit structures 120 may be under compressive stress. Meanwhile, the conductive structures 116, which may be formed of and include a metallic material (e.g., tungsten), may be under tensile stress. Microelectronic device structures and microelectronic devices according to embodiments of the disclosure formed in accordance with methods of the disclosure may prevent crack propagation resulting from such stresses (and others, such as thermal stresses during material formation processes) so as to mitigate (e.g., prevent) short circuits and/or other defects that may be caused by crack propagation.

In some embodiments, the metal structures 140 and the additional metal structures 141 (if any) are formed of and include tungsten. Tungsten may prevent crack propagation, as tungsten has the highest melting point (3422° C., 6192° F.), lowest vapor pressure (at temperatures above 1650° C., 3000° F.), and the lowest coefficient of thermal expansion of any pure metal. The low thermal expansion and high melting originate from strong covalent bonds formed between tungsten atoms.

Figure 2:
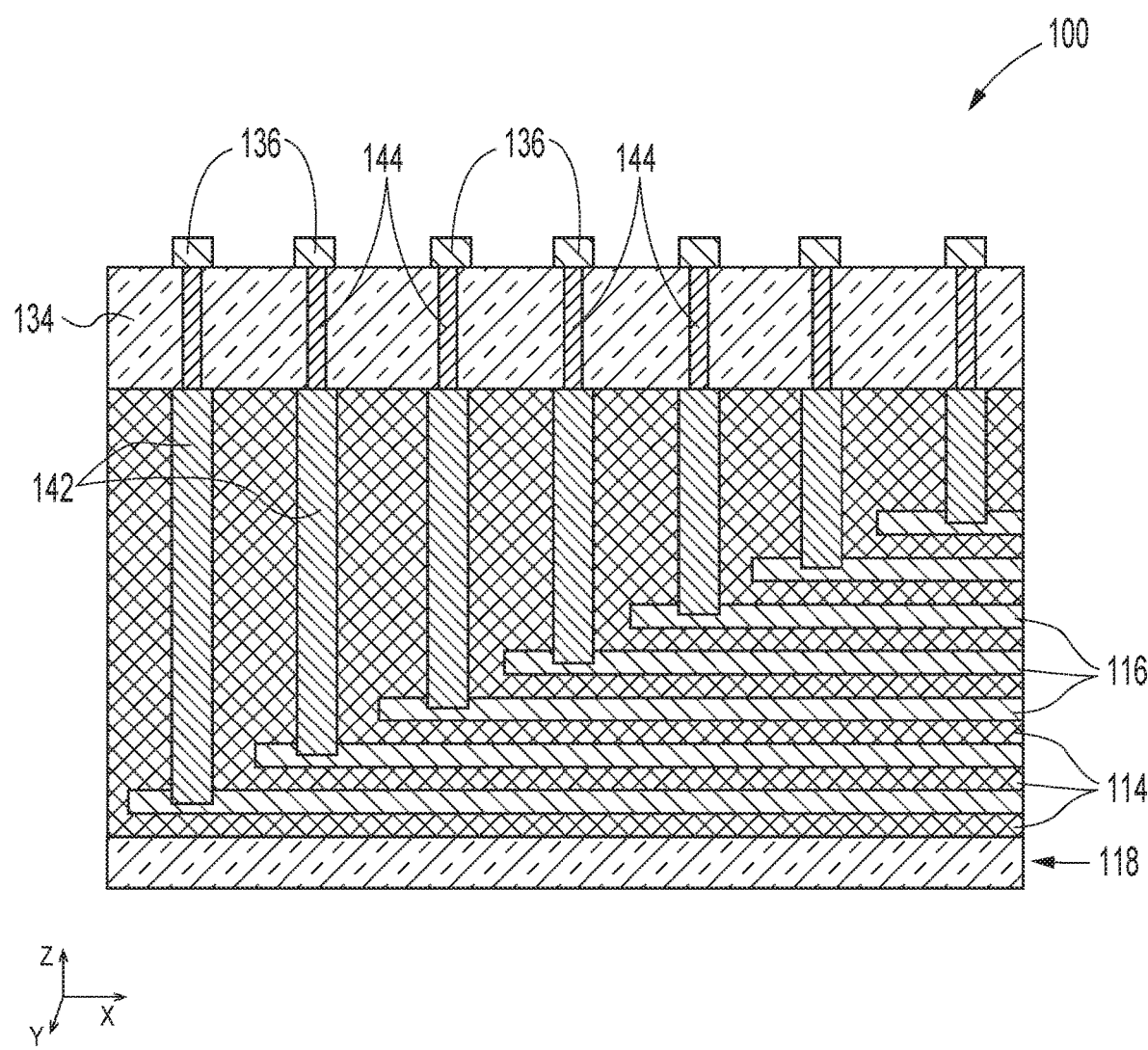
FIG. 2 is a perpendicular cross-sectional, elevational, schematic illustration of the microelectronic device structure of FIG. 1.

FIG. 2 illustrates another cross-sectional view of the microelectronic device structure 100, taken through a block portion 132 (FIG. 1), in a direction perpendicular to the cross-section shown in FIG. 1. As shown, horizontal ends (e.g., in the X-direction) of the conductive structures 116 may be arranged in a staircase configuration. Staircase contacts 142 may extend from the ends of the conductive structures 116 to the insulative structure 134. The staircase contacts 142 may be formed of the same conductive material as the metal structures 140, such as tungsten. Contacts 144 (e.g., bit line contacts) may electrically connect the staircase contacts 142 to overlying bit lines 136 (e.g., digit lines, data lines).

Accordingly, a microelectronic device is disclosed that may include a stack structure comprising a vertically alternating sequence of insulative structures and conductive structures, the stack structure divided into block portions. The microelectronic device may additionally include slit structures horizontally interposed between the block portions of the stack structure. Each of the slit structures may include a dielectric liner covering side surfaces of the stack structure and an upper surface of an additional structure underlying the stack structure, and a plug structure comprising at least one metal surrounded by the dielectric liner.

Additionally, a microelectronic device is disclosed that includes a stack structure comprising conductive structures vertically interleaved with insulative structures, the stack structure having at least one staircase structure therein comprising horizontal ends of the conductive structures. The microelectronic device may additionally include slit structures vertically extending through the stack structure and each having an aspect ratio greater than or equal to about 40 to 1. Each of the slit structures may include a dielectric liner, a semiconductive fill material partially circumscribed by the dielectric liner, and a metal structure partially circumscribed by the semiconductive fill material. The metal structure may be configured to prevent cracks within the semiconductive fill material from propagating outside boundaries of the slit structures.

Figure 3:
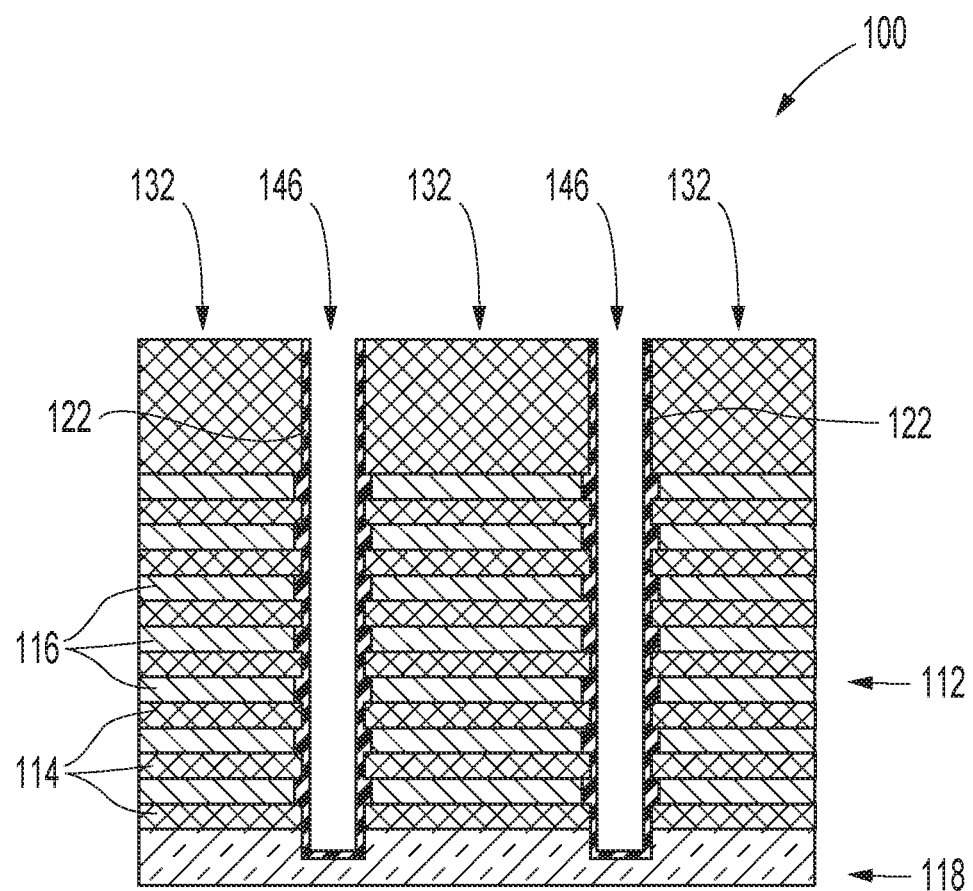
FIG. 3 through FIG. 6 and FIG. 8 through FIG. 11, in conjunction with FIGS. 1 and 2, are cross-sectional, elevational, schematic illustrations during various stages of processing to fabricate the microelectronic device structure illustrated in FIGS. 1 and 2, according to embodiments of the disclosure.

FIG. 3 illustrates the microelectronic device structure 100 in an intermediate stage of manufacturing. As shown, slit openings 146 may be formed through the insulative structures 114 and the conductive structures 116 of the stack structure 112 and extend to or into the source structure 118 and separate the block portions 132 of the stack structure 112. The dielectric liners 122 (e.g., dielectric oxide liners) may be formed to provide a dielectric barrier adjacent the conductive structures 116 of the stack structure 112.

Figure 4:
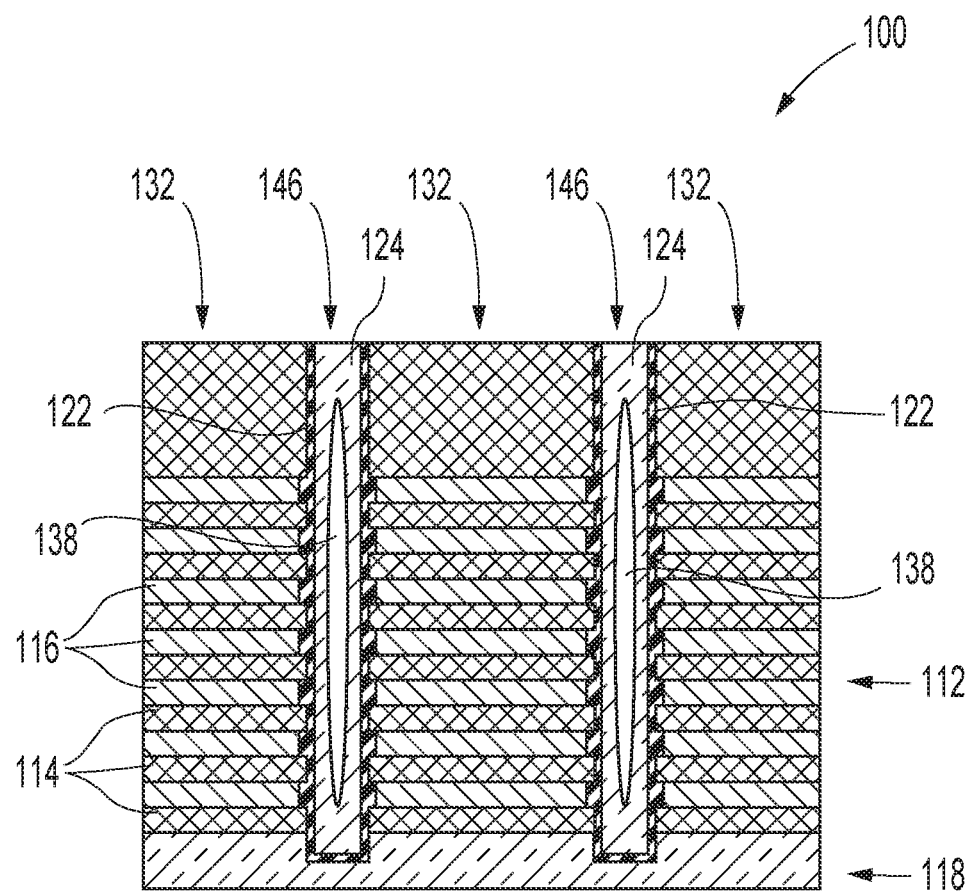

Referring next to FIG. 4, portions of the slit openings 146 unoccupied by the dielectric oxide liners 122 may be filled with the fill material 124 (e.g., polysilicon fill material). In view of the relatively high aspect ratio of the slit openings 146, voids 138 (e.g., openings and/or seams) comprising remaining unfilled portions of the slit openings 146 may be surrounded (e.g., horizontally surrounded, vertically surrounded) by the fill material 124.

Figure 5:
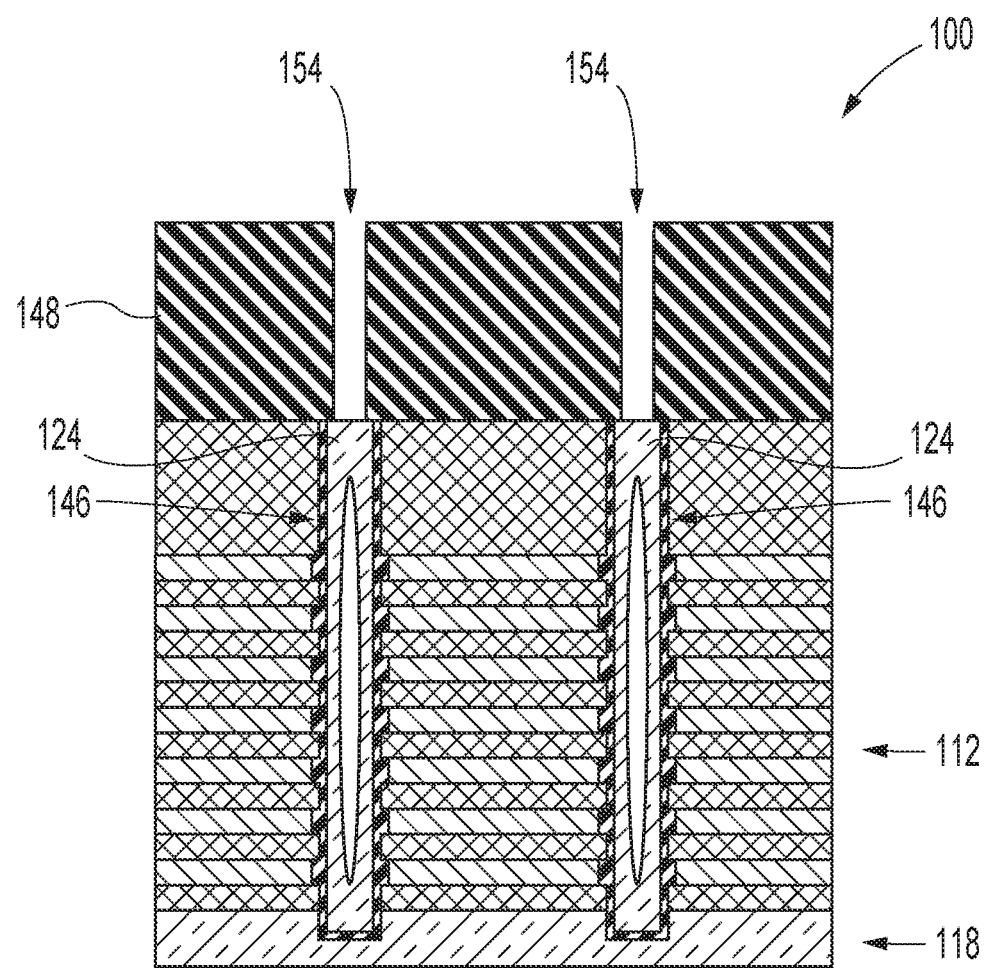
Figure 6:
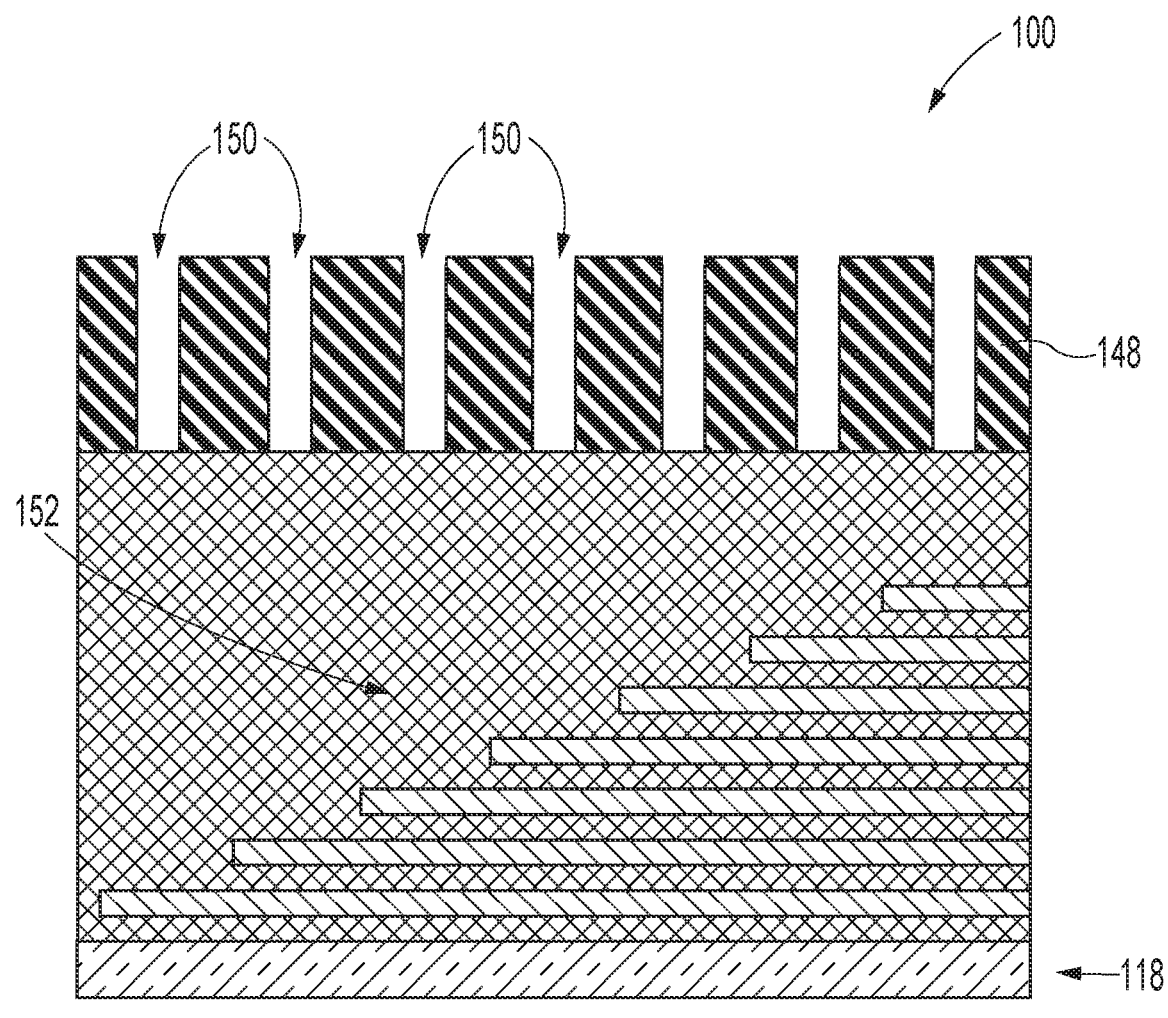
Figure 6:
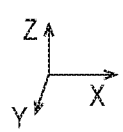

Collectively referring to FIGS. 5 and 6, a hard mask 148 may be formed over the stack structures 112. As shown in FIG. 6, openings 150 (e.g., apertures, through vias) may be formed in the hard mask 148 over the staircase structure 152. Additionally, as shown in FIG. 5, openings 154 may be formed in the hard mask 148 over the fill material 124 within the slit openings 146.

Figure 7:
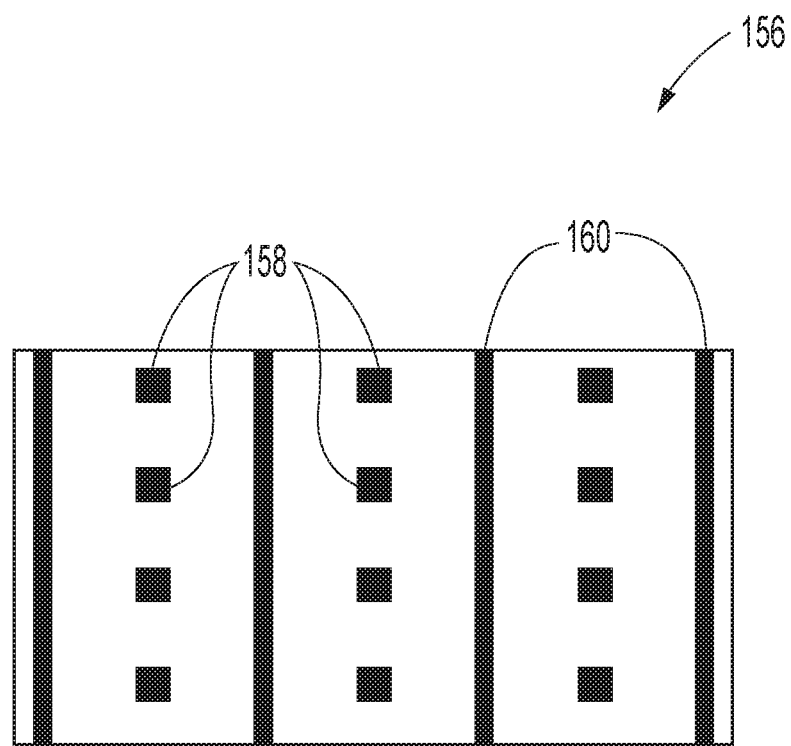
FIG. 7 is a schematic illustration of a portion of a reticle utilized in the fabrication of the microelectronic device structure illustrated in FIGS. 1 and 2.

FIG. 7 depicts a schematic view of a portion of a reticle 156 with features 158 utilized to form the openings 150 in the hard mask 148 (FIG. 6). Although the features 158 may have a generally square shape, the light directed through the features 158 of the reticle 156 may form a circular beam, due to optical features (e.g., lenses), resulting in the openings 150 having a generally cylindrical shape. In addition to the features 158 to form the openings 150 in the hard mask 148 over the staircase structure 152, the reticle 156 may additionally include features 160 to form the openings 154 over the fill material 124 within the slit openings 146 (FIG. 5).

Figure 8:
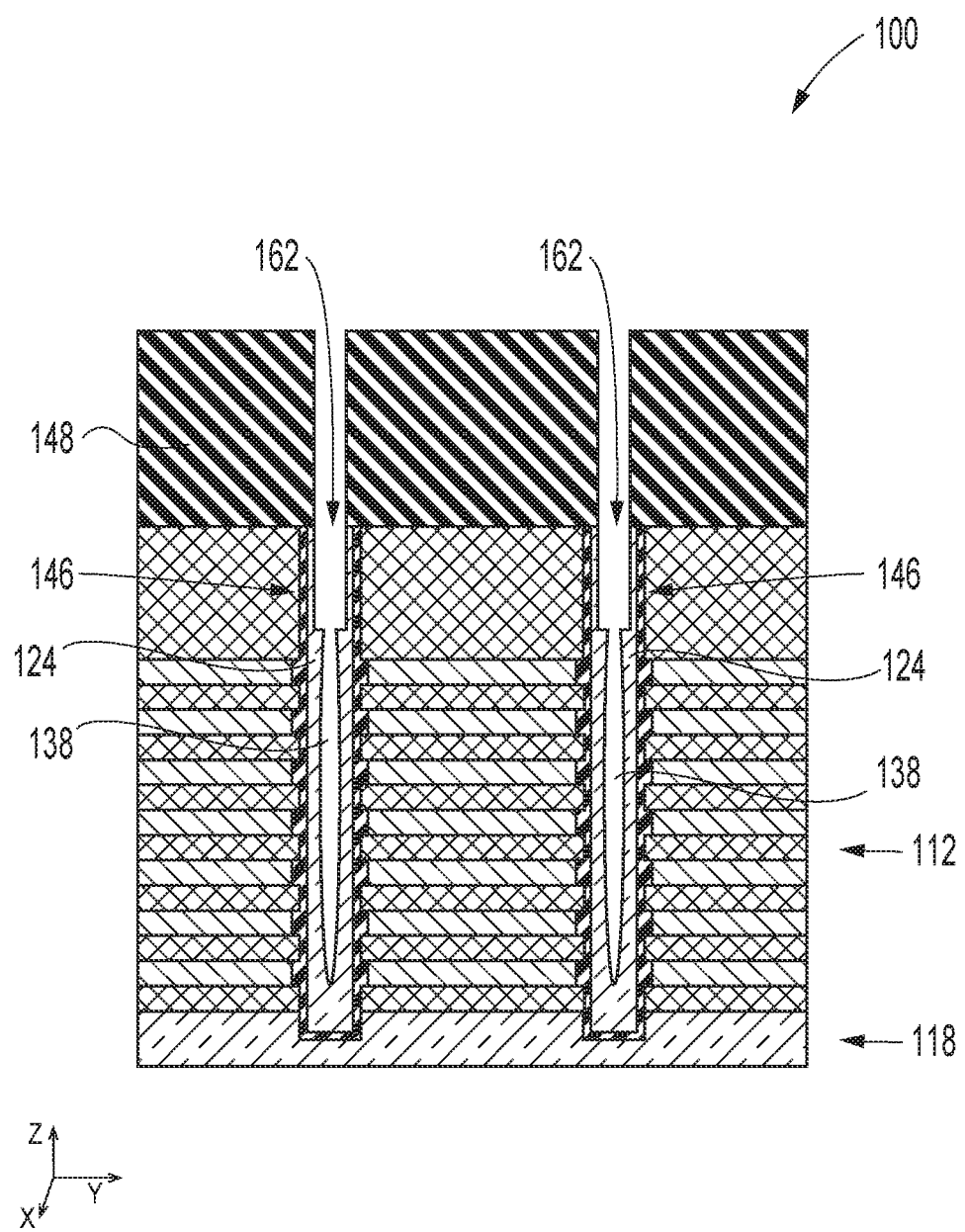

Referring next to FIG. 8, additional openings 162 may formed in the fill material 124 within the slit openings 146 by removal of a portion of the fill material 124, such as by an etching process. The additional openings 162 may extend to the voids 138 in the fill material 124.

Figure 9:
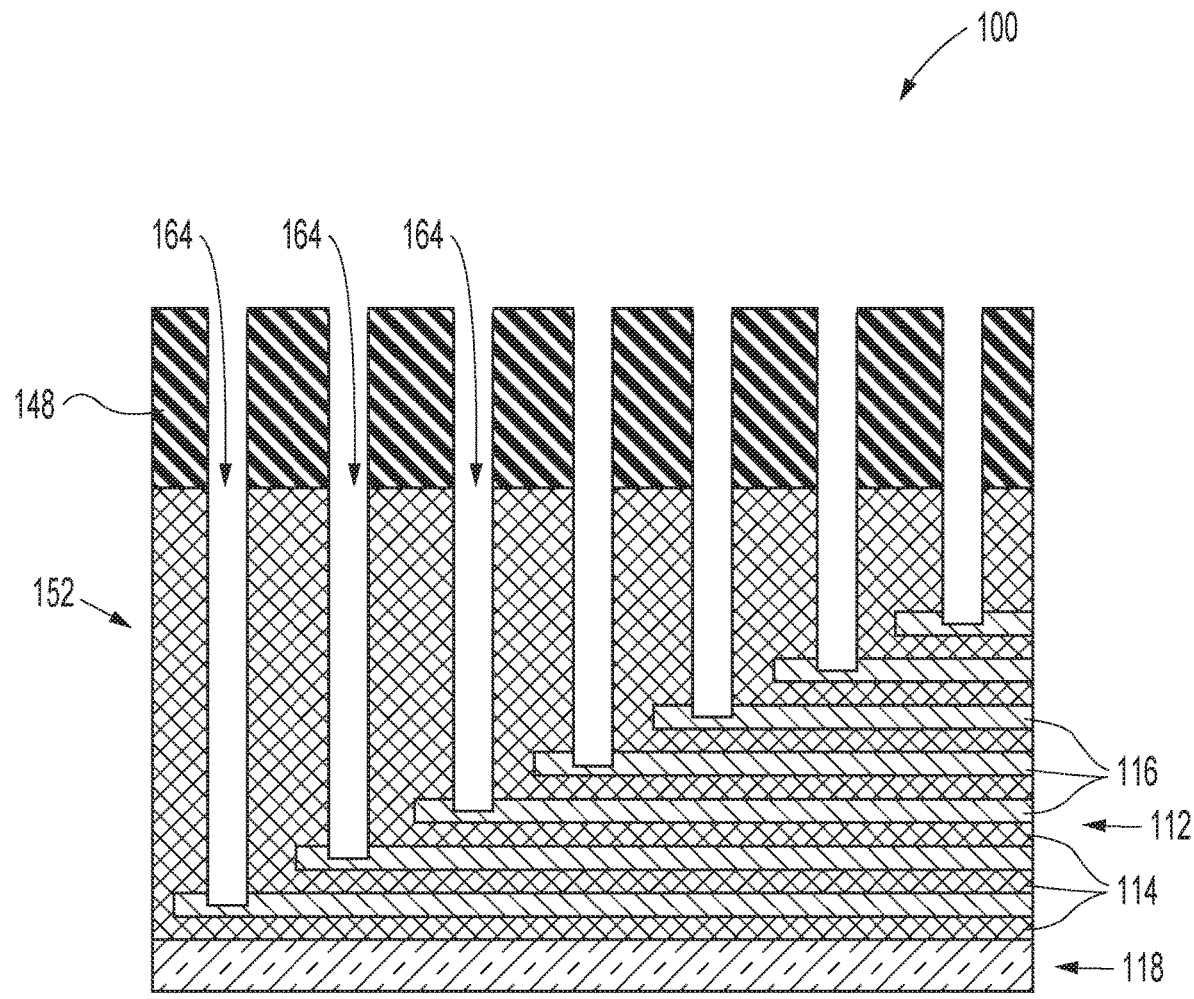
Figure 9:
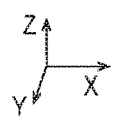

Referring next to FIG. 9, further openings 164 may be formed in the staircase region, each opening 164 extending to a conductive structure 116 of the staircase structure 152. The further openings 164 may be formed simultaneously to the additional openings 162 in the fill material 124 during the same etching procedure. For example, an in-situ etch may be performed to create the further openings 164 extending to the conductive structures 116 of the stack structure 112 at steps (corresponding to horizontal ends of the conductive structures 116) of the staircase structure 152 for the formation of the staircase contacts 142 (FIG. 2). Simultaneously, as shown in FIG. 8, the in-situ etch may etch the additional openings 162 in the fill material 124 within each slit opening 146.

Figure 10:
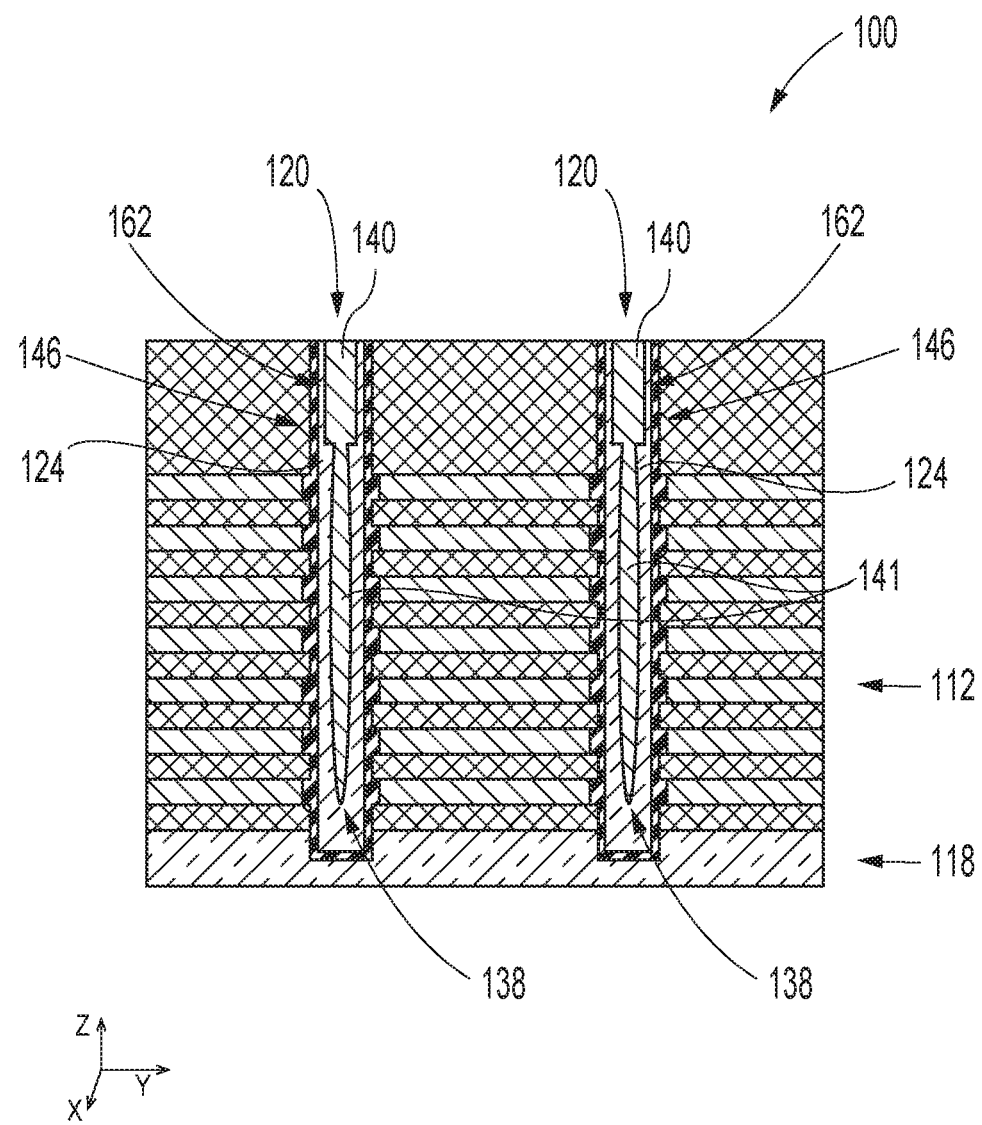

Referring next to FIG. 10, the hard mask 148 may be removed and one or more metal materials (e.g., one or more of titanium, titanium nitride, and tungsten) may be formed in the additional openings 162 to form the metal structures 140 (e.g., metal plugs). Optionally, for any of the additional openings 162 that extend to a void 138, the void 138 may also be filled with the one or more metal materials to form the additional metal structures 141. If the voids 138 are completely filled with metal, it may prevent cracks from developing within the fill material 124. However, even if the voids are not completely filled and a crack forms within a slit, the crack may be prevented from propagating outside of the slit by the metal plug positioned at an end of the slit.

Figure 11:
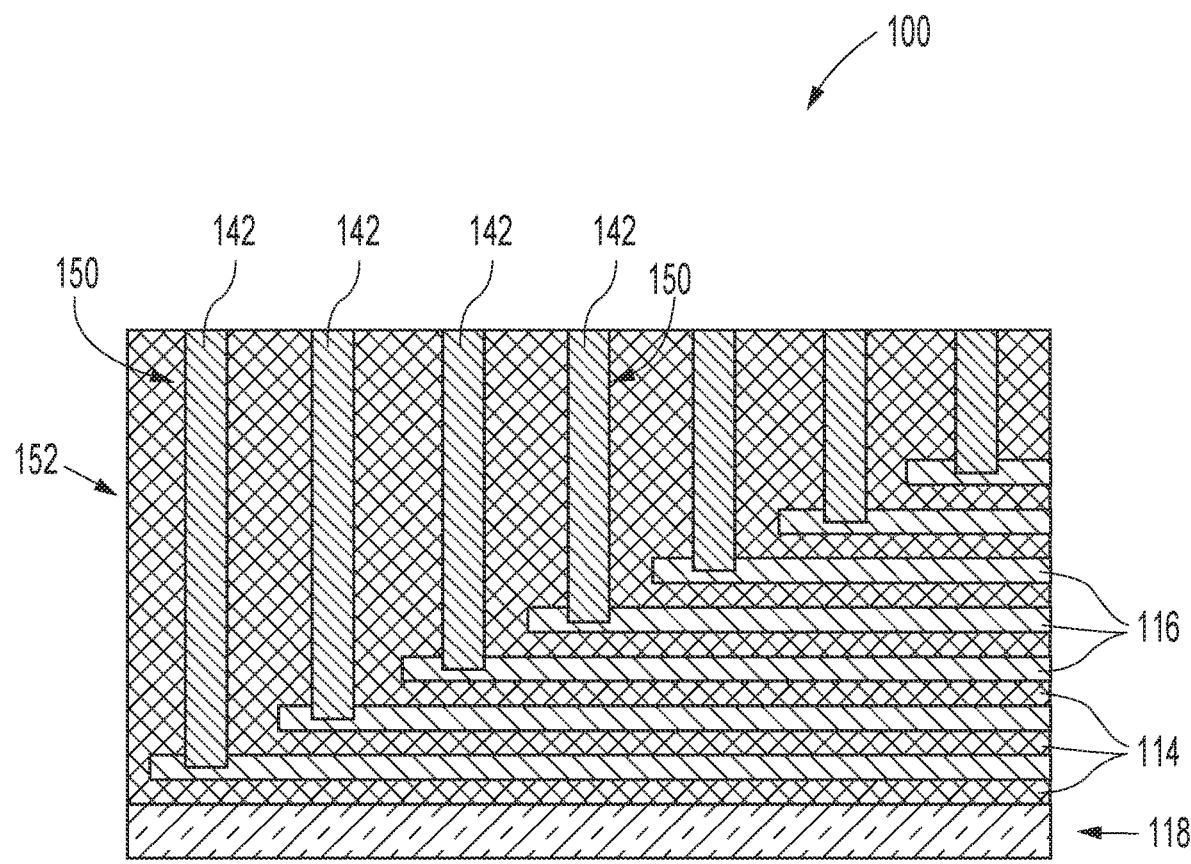

Referring next to FIG. 11, the staircase contacts 142 may be formed in the further openings 150. The staircase contacts 142 may be formed simultaneously with the formation of the metal structures 140, and with the same metal materials as the metal structures 140. Additional structures, such as the insulative structure 134 (e.g., an oxide structure) and the bit lines 136 may then be formed over the stack structure 112 and slit structures 120 (FIG. 1).

Accordingly, a method of forming a microelectronic device is disclosed that may include forming at least one slit opening extending through a stack structure comprising a vertically alternating sequence of insulative structures and conductive structures. The method may further include forming a dielectric liner within the at least one slit opening, and forming a metal structure within a portion of the at least one slit opening remaining following the formation of the dielectric liner, side surfaces and a bottom surface of the metal structure substantially surrounded by the dielectric liner.

Figure 12:
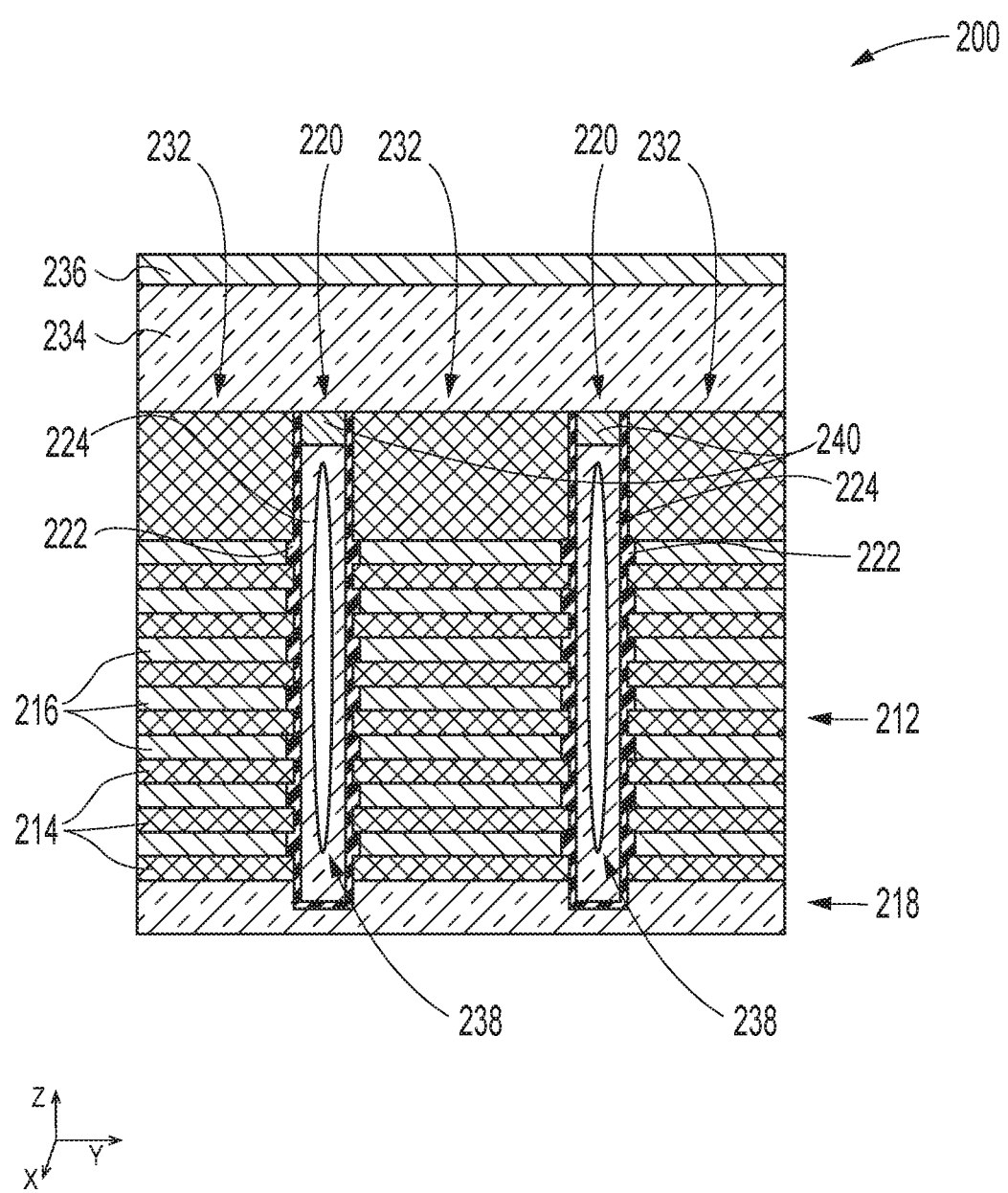
FIG. 12 is a cross-sectional, elevational, schematic illustration of a microelectronic device structure, according to further embodiments of the disclosure, with slit structures including metal plugs.

FIG. 12 illustrates a cross-sectional view of a microelectronic device structure 200 (e.g., a memory device structure, such as a 3D NAND memory device structure) according to additional embodiments of the disclosure, for an apparatus (e.g., a memory device, such as a 3D NAND memory device), which may be included in a system. Similar to the microelectronic device structure 100 of FIG. 1, the microelectronic device structure 200 includes a stack structure 212, with vertically alternating insulative structures 214, comprising insulative material (e.g., dielectric oxide, such as silicon oxide), and conductive structures 216 comprising conductive material (e.g., metal, such as tungsten (W); conductively doped semiconductive material, such as conductively doped polysilicon).

Below the stack structure 212, one or more substrate or other base materials, support the stack structure 212. For example, the stack structure 212 may be arranged above a source structure 118, which may comprise polysilicon material.

Slit structures 220 which may comprise at least one dielectric liner, such as a dielectric oxide liner 222, and may be at least partially filled with a fill material, such as a fill material 224, may extend through the stack structure 212 and into the source structure 218. The dielectric oxide liner 222 may electrically isolate the fill material 224 of the slit structures 220 from the source structure 218. The slit structures 220 may extend similarly to an elongated trench and divide the stack structure 212 into block portions 232.

Additional structures, such as an insulative structure 234 (e.g., an oxide structure) and bit lines 236 may overly the stack structure 212 and slit structures 220.

The slit structures 220 may have a relatively high aspect ratio (e.g., the ratio of a depth relative to a width). In some embodiments, the slit structures 220 may have an aspect ratio greater than 40:1. In further embodiments, the slit structures 220 may have an aspect ratio greater than 50:1. In yet further embodiments, the slit structures 220 may have an aspect ratio greater than 60:1. The fill material 224 formed in the slit structures 220 may include voids 238 (e.g., openings and/or seams), due to the relatively high aspect ratio of the slit structures 220, etch bow, and the fill capability of the fill material 224.

The slit structures 220 may further include a metal structure, such as a metal plug 240, which may fill a region at an end of the slit structures 220. For example, the metal plug 240 may be comprised of one or more of titanium, titanium nitride, and tungsten. The voids 238 within the fill material 224 may remain open. However, even with the voids 238 within the fill material 224 unfilled, if a crack forms within a slit structure 220, the crack may be prevented from propagating outside of the slit structure 220 by the metal plug 240 positioned at an end of the slit structure 220.

In some embodiments, tungsten may be utilized and the metal plug 240 may be a tungsten plug formed within each slit structure 220. As previously discussed, tungsten may be a very effective metal to prevent crack propagation.

Figure 13:
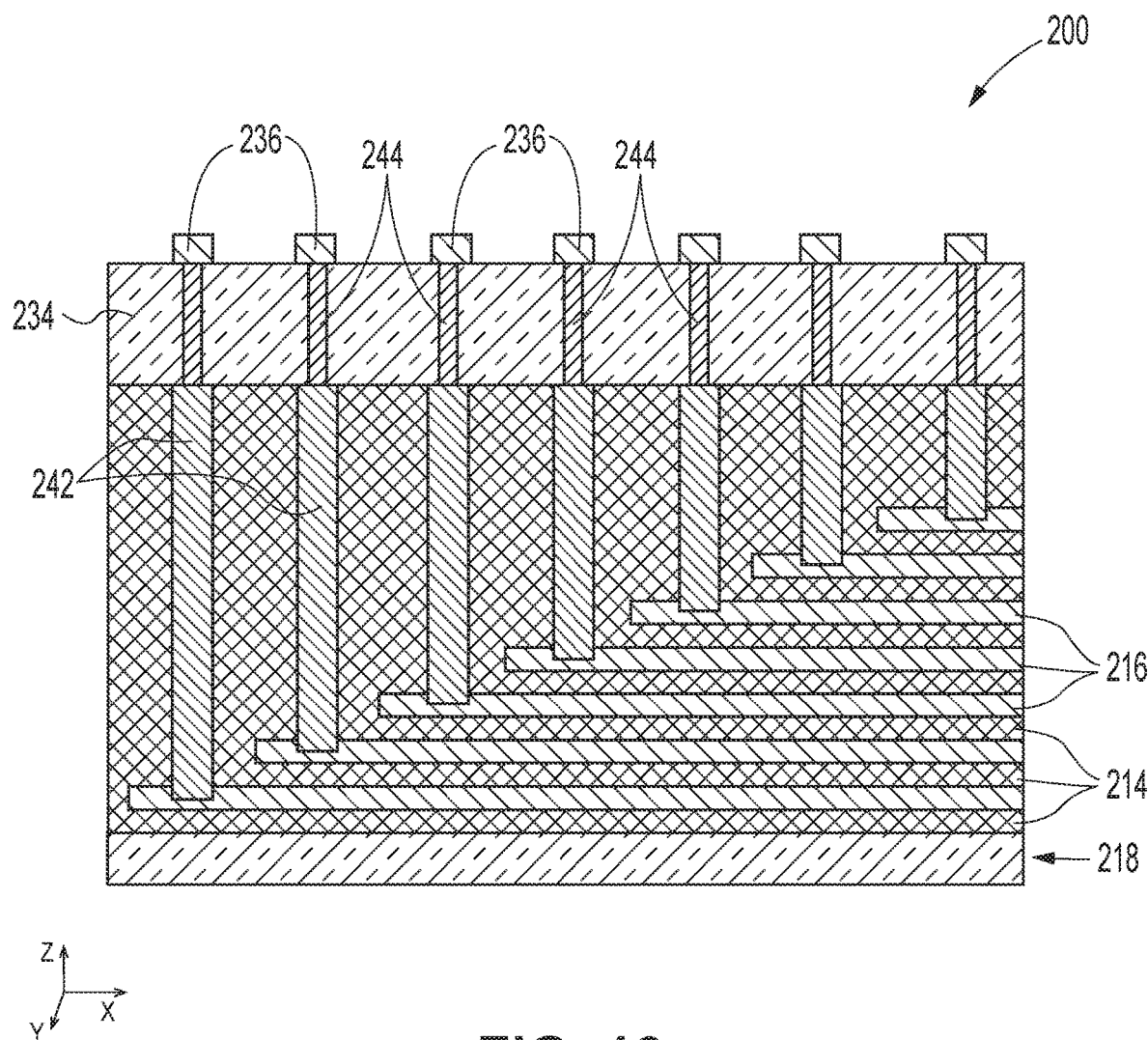
FIG. 13 is a perpendicular cross-sectional, elevational, schematic illustration of the microelectronic device structure of FIG. 12.

FIG. 13 illustrates another cross-sectional view of the microelectronic device structure 200, taken through a block portion 232 (FIG. 12), in a direction perpendicular to the cross-section shown in FIG. 12. As shown, horizontal ends (e.g., in the X-direction) of the conductive structures 216 may be arranged in a staircase configuration. Staircase contacts 242 may extend from the ends of the conductive structures 216 to the insulative structure 234. The staircase contacts 242 may be formed of the same conductive material as the metal structures 240, such as tungsten. Contacts 244 (e.g., bit line contacts) may electrically connect the staircase contacts to overlying bit lines 236 (e.g., digit lines, data lines).

Figure 14:
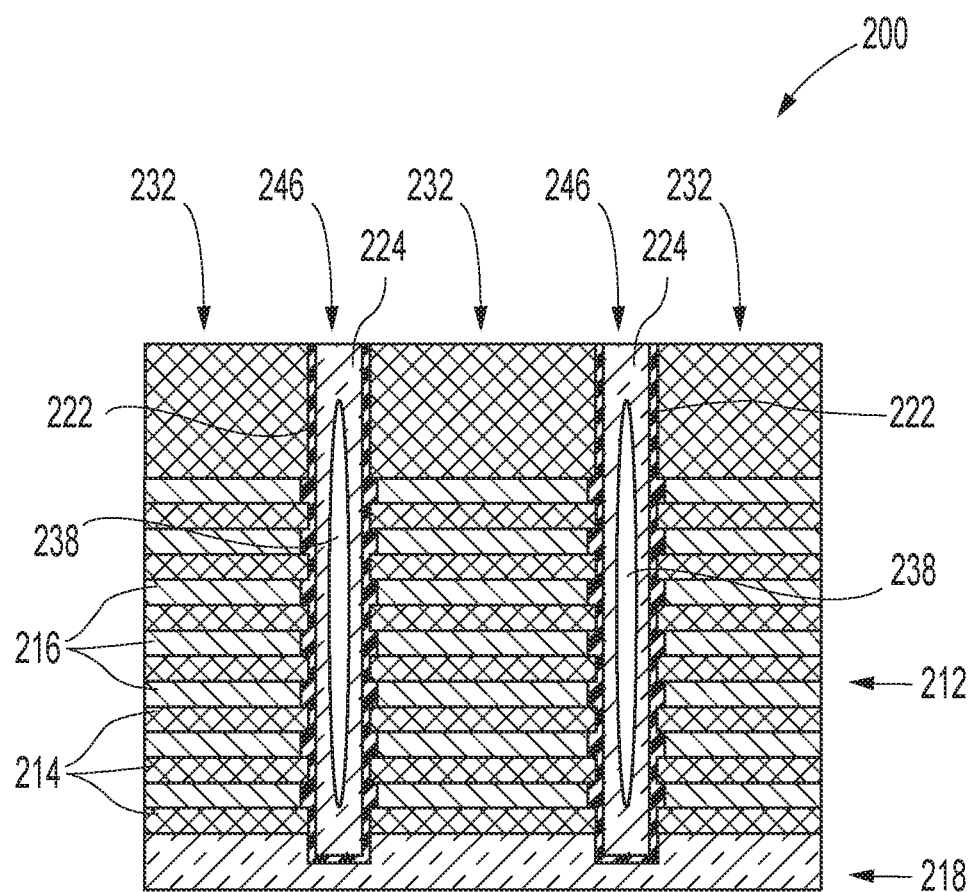
FIG. 14 through FIG. 20, in conjunction with FIGS. 12 and 13, are cross-sectional, elevational, schematic illustrations during various stages of processing to fabricate the microelectronic device structure illustrated in FIGS. 12 and 13, according to embodiments of the disclosure.

FIG. 14 illustrates the microelectronic device structure 200 in an intermediate stage of manufacturing. A shown, portions of the slit openings 246 unoccupied by the dielectric oxide liners 222 may be filled with a fill material 224 (e.g., polysilicon fill material). In view of the relatively high aspect ratio of the slit openings 246, voids 238 (e.g., openings and/or seams) comprising remaining unfilled portions of the slit openings 146 may be surrounded (e.g., horizontally surrounded, vertically surrounded) by the fill material 224.

Figure 15:
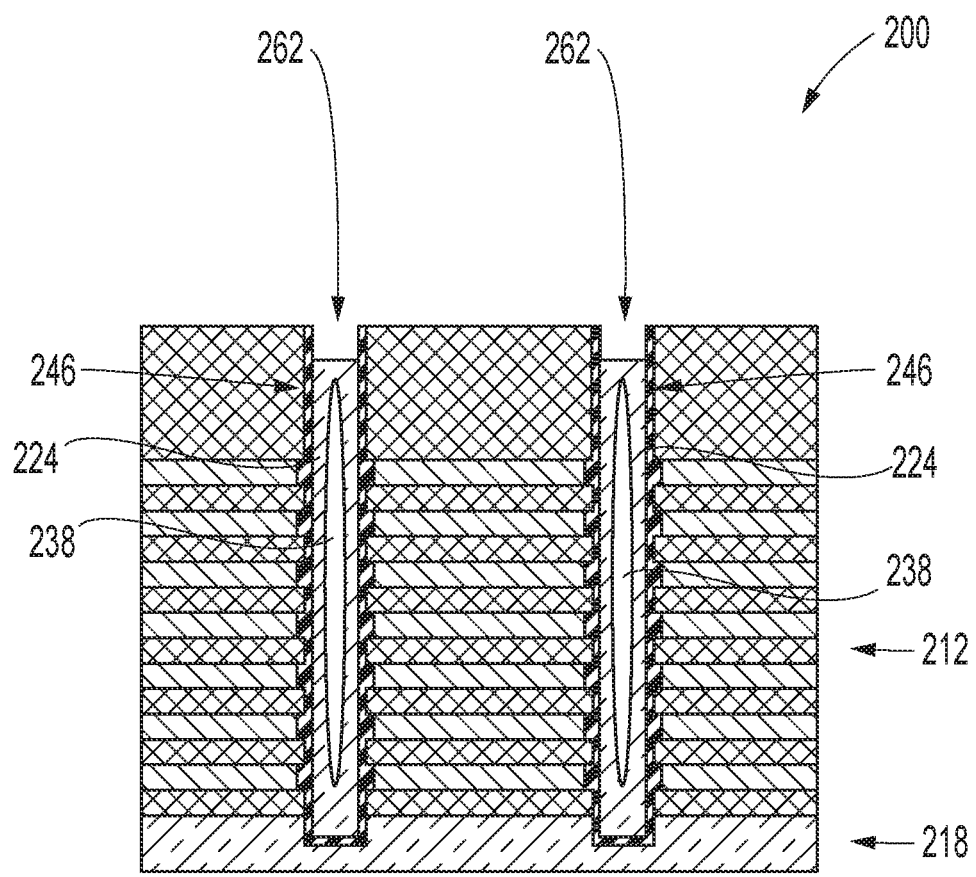
Figure 15:
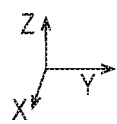

Referring next to FIG. 15, individual openings 262 may formed in the fill material 224 within each of the slit openings 246 by removal of a portion of the fill material 224, such as by an etching process. If a wet etch process is utilized, the etching may be stopped to prior to the openings 262 reaching any void 238 to prevent any chemical etchant, such as tetramethylammonium hydroxide (TMAH), or ammonia and hydrogen peroxide mixtures (APM), from entering any void 238. Optionally, a dry etch process may be utilized, and the etching may form openings that extend to and expose the voids 238.

Figure 16:
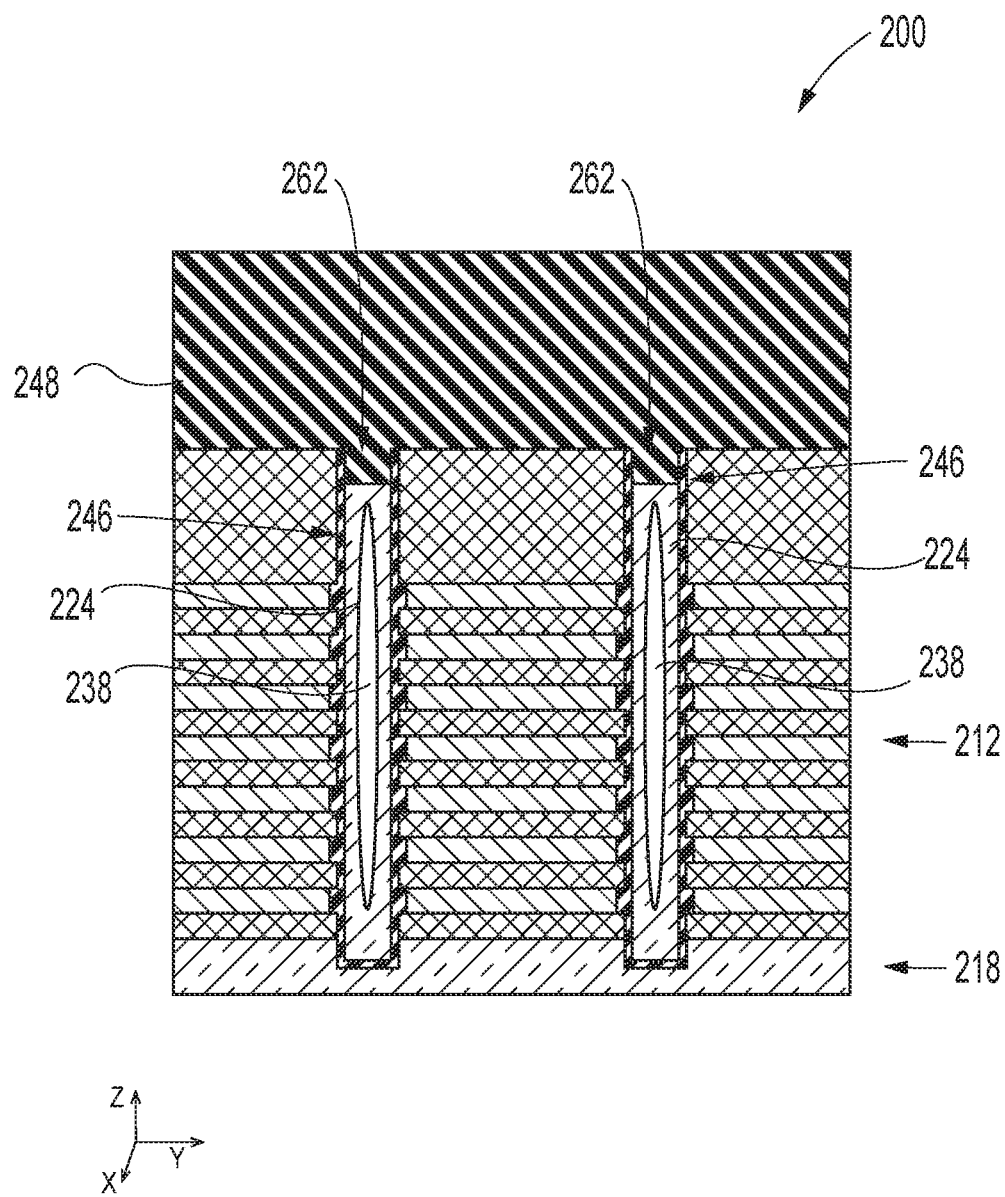
Figure 17:
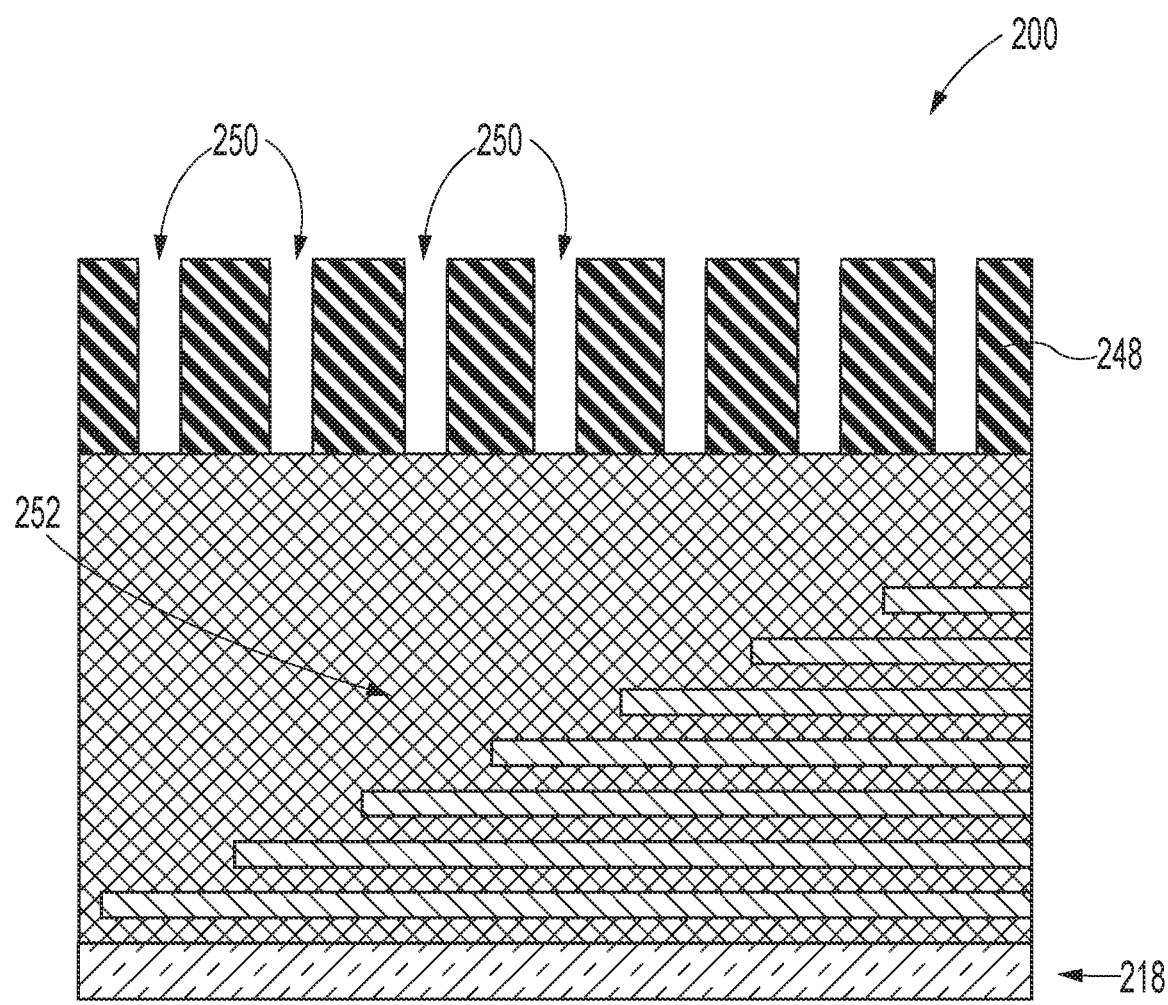

Collectively referring to FIGS. 16 and 17, a hard mask 248 may be formed over the stack structures 212 and over the openings 262. As shown in FIG. 17, openings 250 (e.g., apertures, through vias) may be formed in the hard mask 248 over the staircase structure 252.

Figure 18:
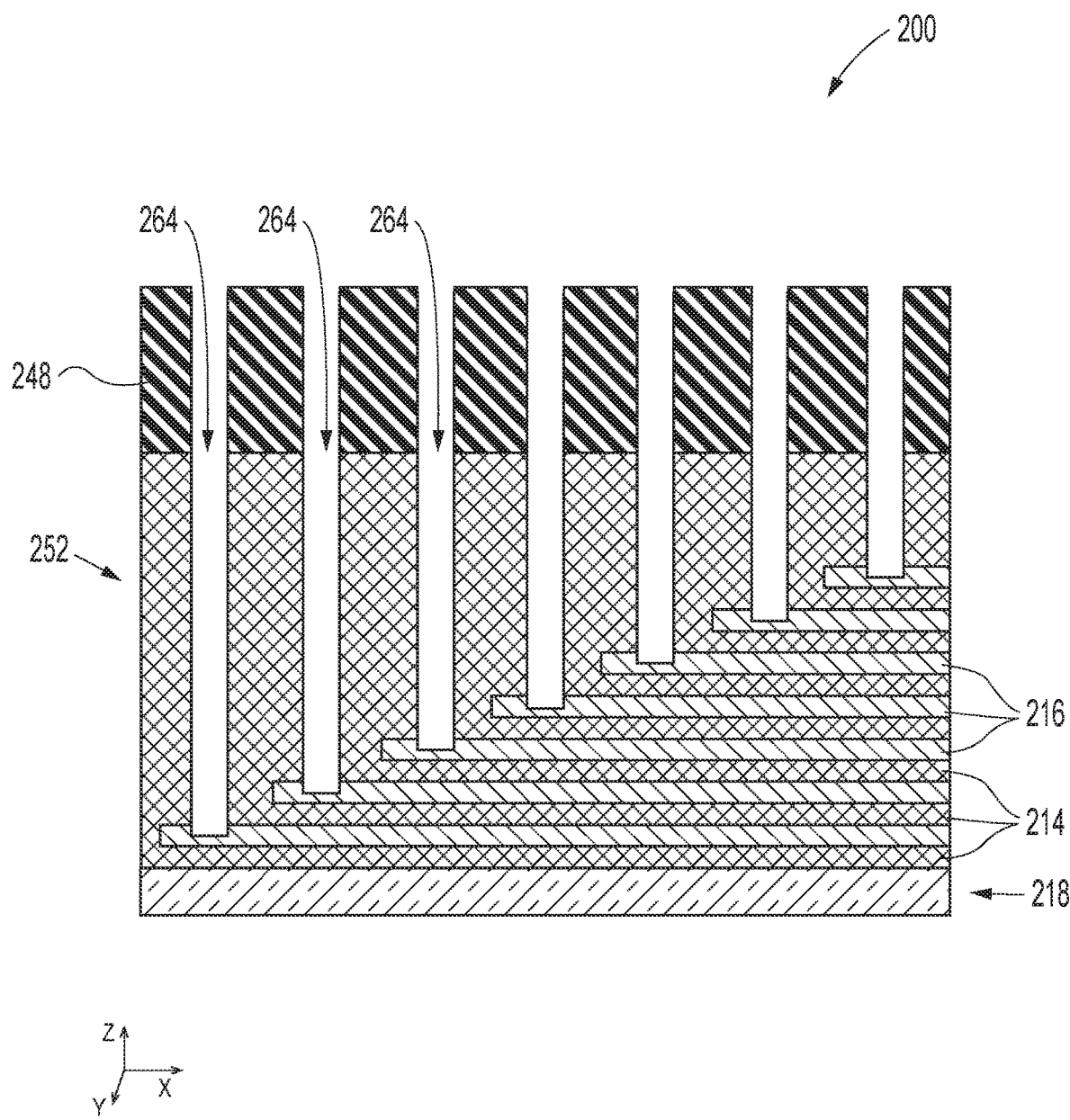

Referring next to FIG. 18, openings 264 may be formed in the staircase region, each opening 264 extending to a conductive structure 216 of the staircase structure 252. For example, an in-situ etch may be performed to create openings 264 extending to the conductive structures 216 at steps (corresponding to horizontal ends of the conductive structures 116) of the staircase structure 252 for the formation of the staircase contacts 242 (FIG. 13). While the openings 264 are formed, the hard mask 248 may cover and protect the fill material 224.

Figure 19:
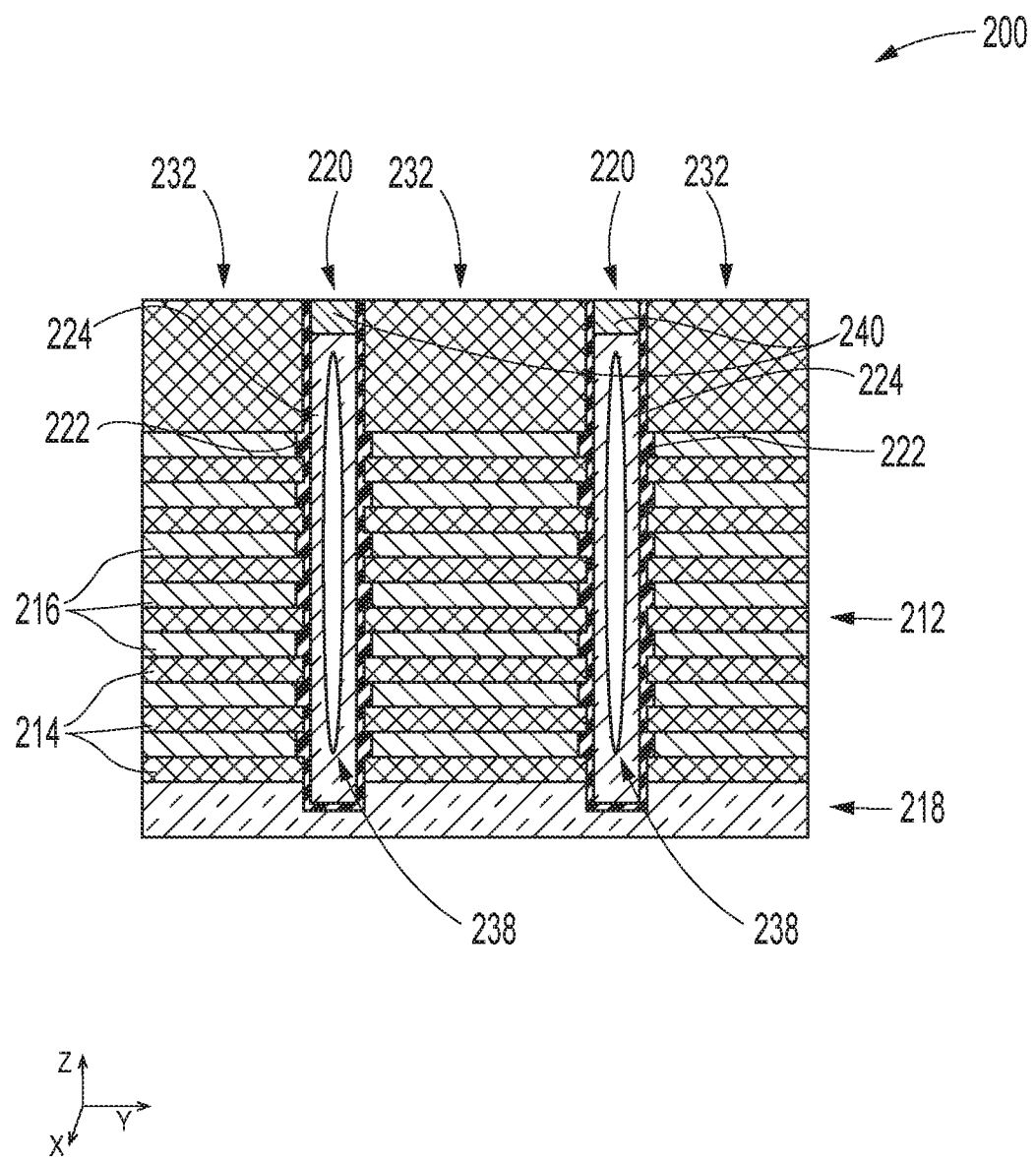

Referring next to FIG. 19, the hard mask 248 may be removed and one or more metal materials (e.g., one or more of titanium, titanium nitride, and tungsten) may be formed in the openings 262 of the fill material 224 within the slit openings 246 to form the metal structures 240 (e.g., metal plugs). Optionally, if any of the openings 262 extend to a void 238, the void 238 may also be filled with the one or more metal materials. If the voids are completely filled with metal, it may prevent any cracks from developing within the fill material 224. However, even if the voids are not completely filled and a crack forms within a slit, the crack may be prevented from propagating outside of the slit by the metal plug positioned at an end of the slit.

Figure 20:
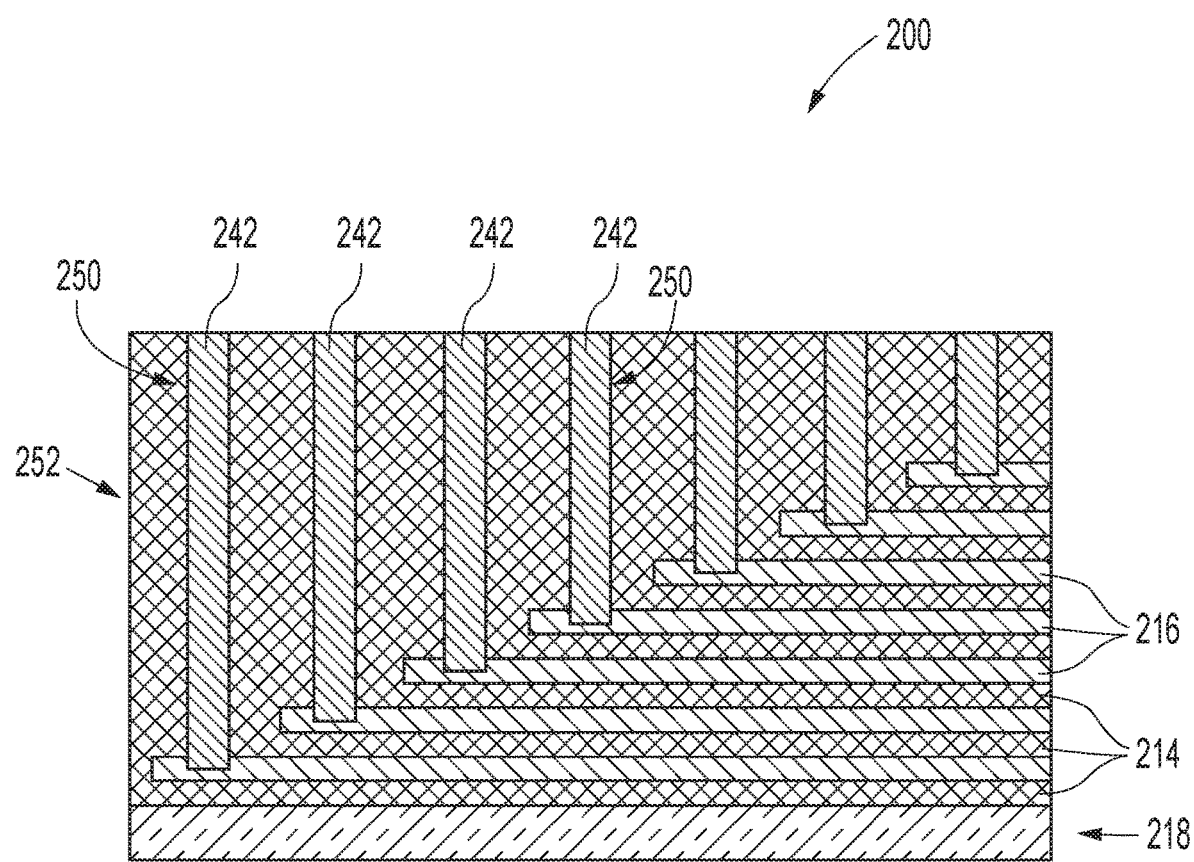

Referring next to FIG. 20, the staircase contacts 242 may be formed in the openings 250. The staircase contacts 242 may be formed simultaneously with the formation of the metal structures 240, and with the same metal materials as the metal structures 240. Additional structures, such as the insulative structure 234 (e.g., an oxide structure) and the bit lines 236 may then be formed over the stack structure 212 and slit structures 220 (FIG. 12).

Figure 21:
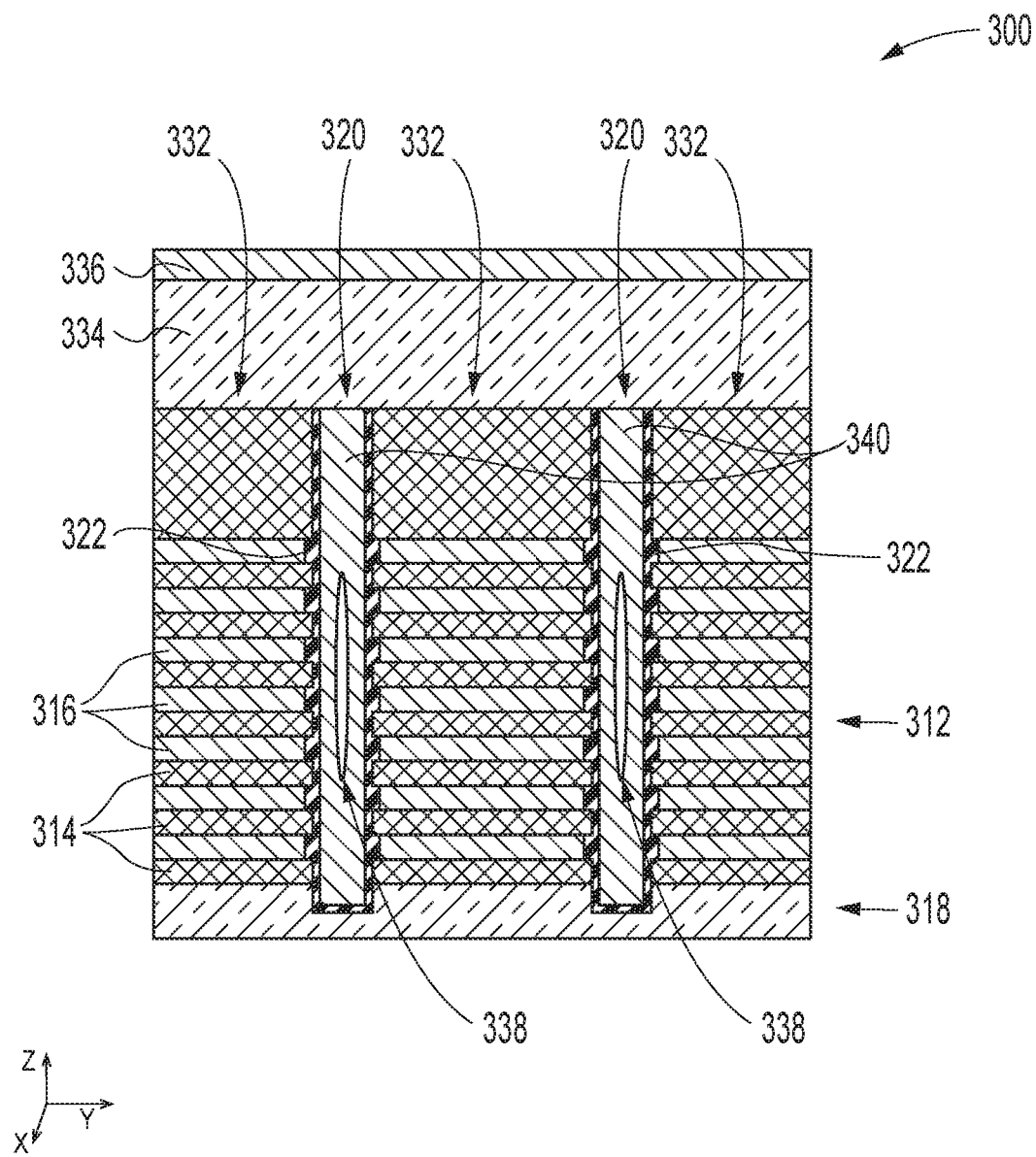
FIG. 21 is a cross-sectional, elevational, schematic illustration of a microelectronic device structure, according to further embodiments of the disclosure, with slit structures including metal plugs.

FIG. 21 illustrates a cross-sectional view of a microelectronic device structure 300 (e.g., a memory device structure, such as a 3D NAND memory device structure) according to embodiments of the disclosure, for an apparatus (e.g., a memory device, such as a 3D NAND memory device), which may be included in a system. Similarly to the microelectronic device structure 100 of FIG. 1, the microelectronic device structure 300 includes a stack structure 312, with vertically alternating insulative structures 314, comprising insulative material (e.g., dielectric oxide, such as silicon oxide), and conductive structures 316 comprising conductive material (e.g., metal, such as tungsten (W); conductively doped semiconductive material, such as conductively doped polysilicon).

Below the stack structure 312, one or more substrate or other base materials, support the stack structure 312. For example, the stack structure 312 may be arranged above a source structure 318, which may comprise polysilicon material.

Slit structures 320 which may comprise at least one dielectric liner, such as a dielectric oxide liner 322, and may be at least partially filled with a fill material, such as a metal fill material to form metal structures 340, may extend through the stack structure 312 and into the source structure 318. The dielectric oxide liner 322 may electrically isolate the metal structure 340 of the slit structures 320 from the source structure 318. The slit structures 320 may extend similarly to an elongated trench and divide the stack structure 312 into block portions 332.

Additional structures, such as an insulative structure 334 (e.g., an oxide structure) and bit lines 336 may overly the stack structure 312 and slit structures 320.

The slit structures 320 may have a relatively high aspect ratio (e.g., the ratio of a depth relative to a width). In some embodiments, the slit structures 320 may have an aspect ratio greater than 40:1. In further embodiments, the slit structures 320 may have an aspect ratio greater than 50:1. In yet further embodiments, the slit structures 320 may have an aspect ratio greater than 60:1. The metal structure 340 formed in the slit structures 320 may include voids 338 (e.g., openings and/or seams), due to the relatively high aspect ratio of the slit structures 320, etch bow, and the fill capability of the metal fill material.

The metal structures 340 may be comprised of one or more of titanium, titanium nitride, and tungsten. The voids 338 within the metal structures 340 may remain open. However, even with the voids 338 within the metal structures 340 unfilled, the crack may be prevented from forming and/or propagating outside of the slit structure 320 by the metal structure 340 filling the dielectric oxide liner 322 of the slit structure 320.

In some embodiments, tungsten may be utilized and the metal structure 340 may be a tungsten plug formed within each slit structure 320. As previously discussed, tungsten may be a very effective metal to prevent crack propagation.

Figure 22:
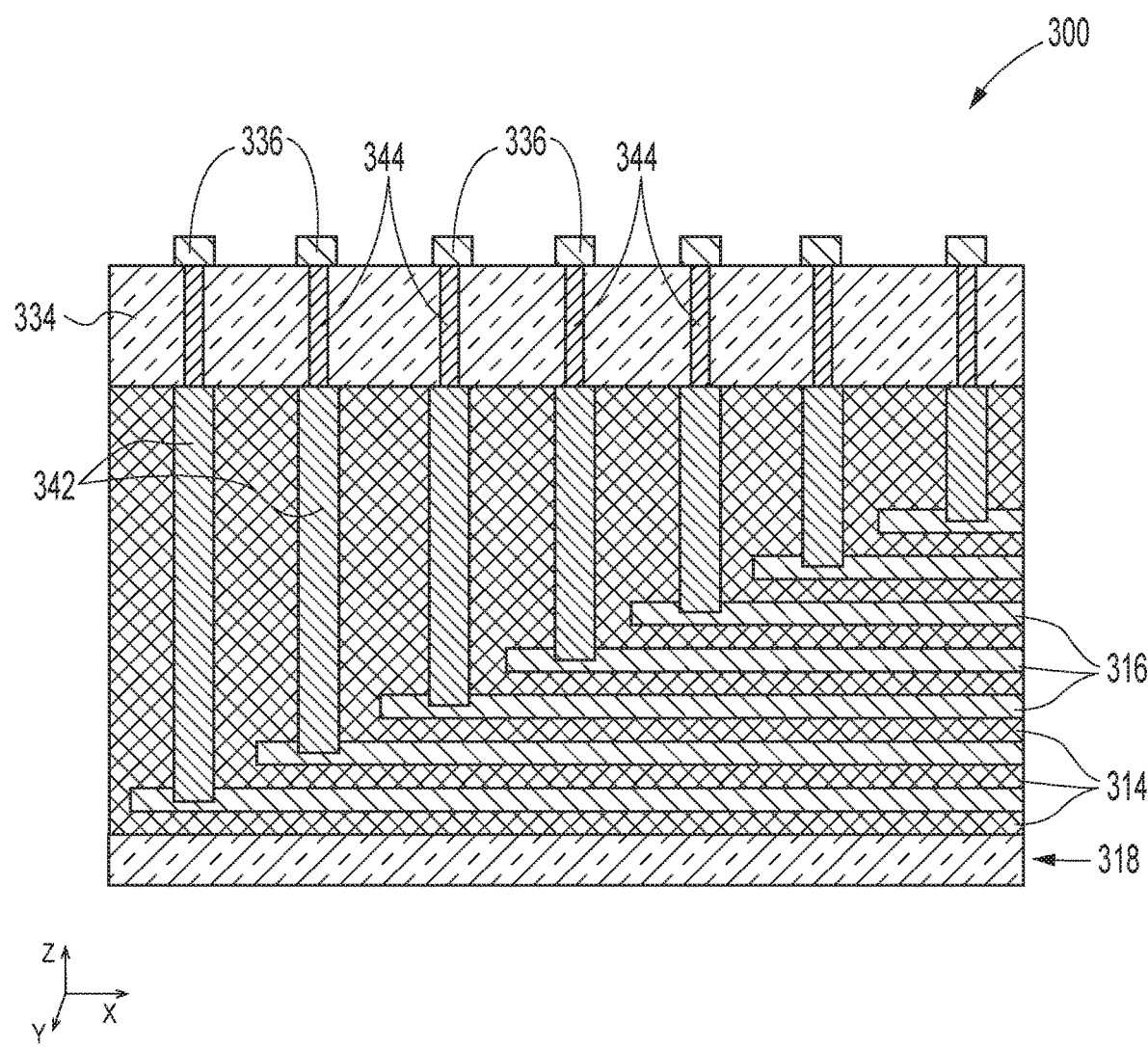
FIG. 22 is a perpendicular cross-sectional, elevational, schematic illustration of the microelectronic device structure of FIG. 21.

FIG. 22 illustrates another cross-sectional view of the microelectronic device structure 200, taken through a block portion 332 (FIG. 21), in a direction perpendicular to the cross-section shown in FIG. 21. As shown, horizontal ends (e.g., in the X-direction) of the conductive structures 316 may be arranged in a staircase configuration. Staircase contacts 342 may extend from the ends of the conductive structures 316 to the insulative structure 334. The staircase contacts 342 may be formed of the same conductive material as the metal structures 340, such as tungsten. Contacts 344 (e.g., bit line contacts) may electrically connect the staircase contacts to overlying bit lines 336 (e.g., digit lines, data lines).

Figure 23:
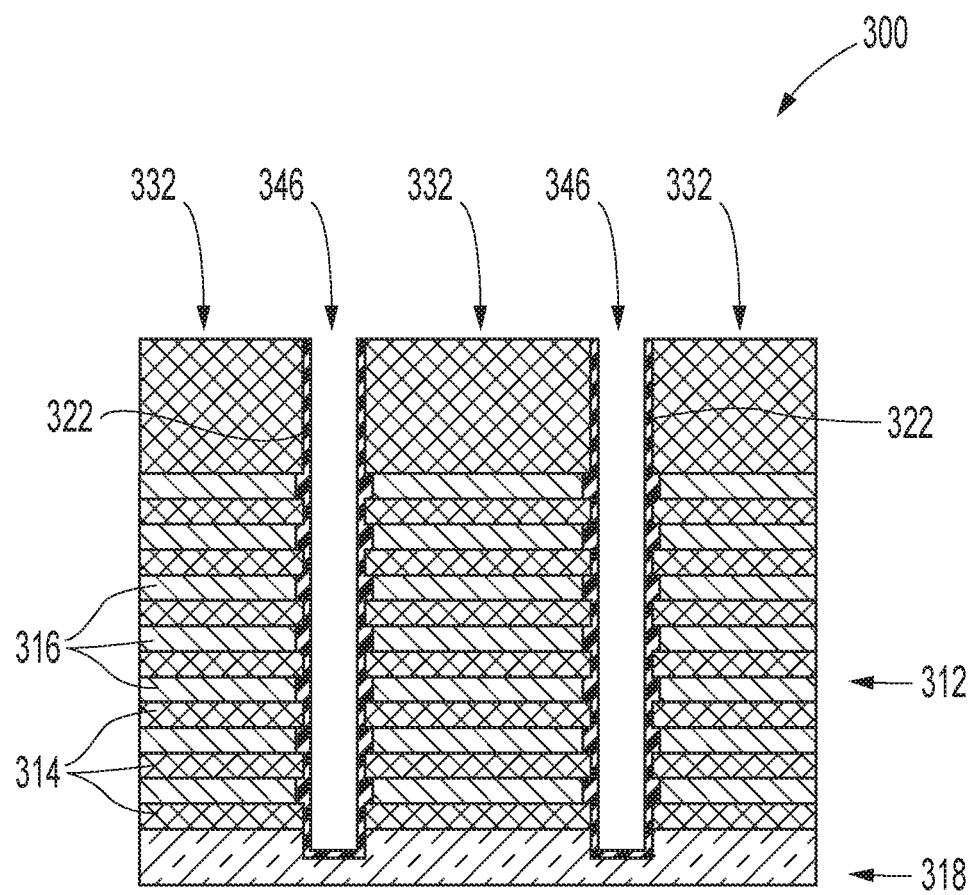
FIG. 23 through FIG. 28, in conjunction with FIGS. 21 and 22, are cross-sectional, elevational, schematic illustrations during various stages of processing to fabricate the microelectronic device structure illustrated in FIGS. 21 and 22, according to embodiments of the disclosure.

FIG. 23 illustrates the microelectronic device structure 300 in an intermediate stage of manufacturing. As shown, slit openings 346 may be formed through the insulative structures 314 and conductive structures 316 of the stack structure 312 and extend into the source structure 318 and separate the block portions 332 of the stack structure 312. The dielectric liners 322 (e.g., dielectric oxide liners) may be formed to provide a dielectric barrier adjacent the conductive structures 316 of the stack structure 312.

Figure 24:
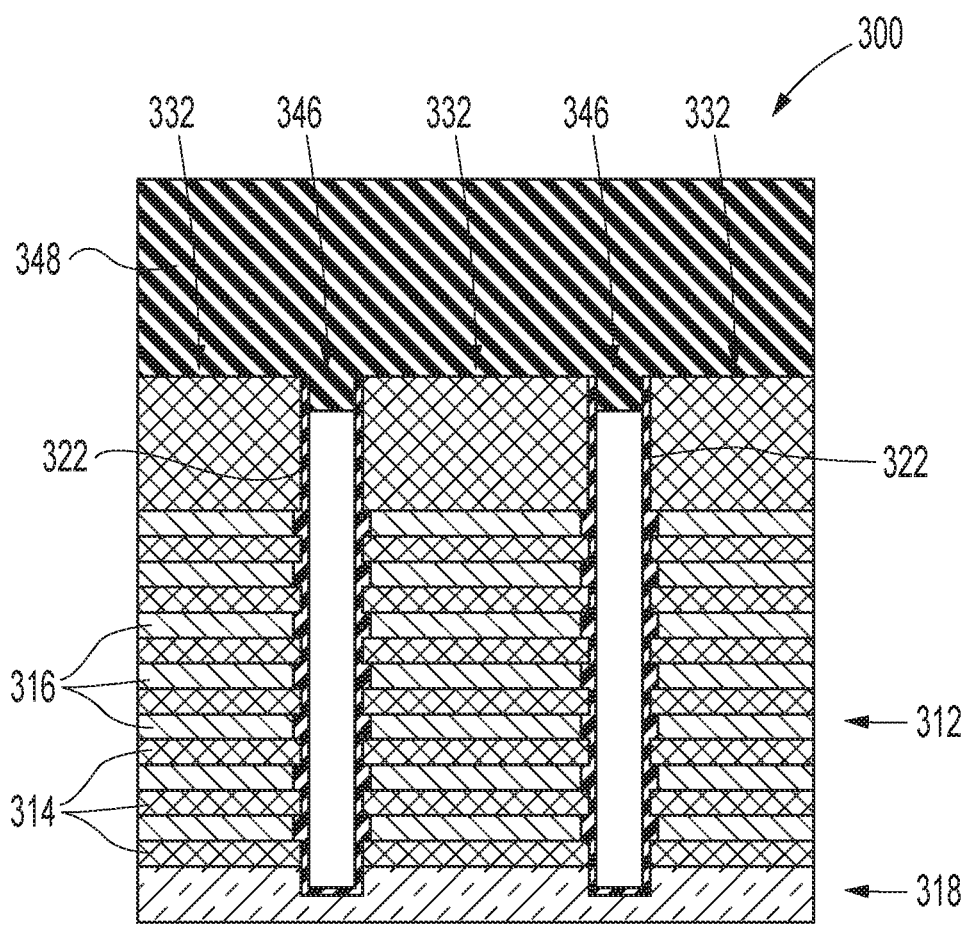
Figure 25:
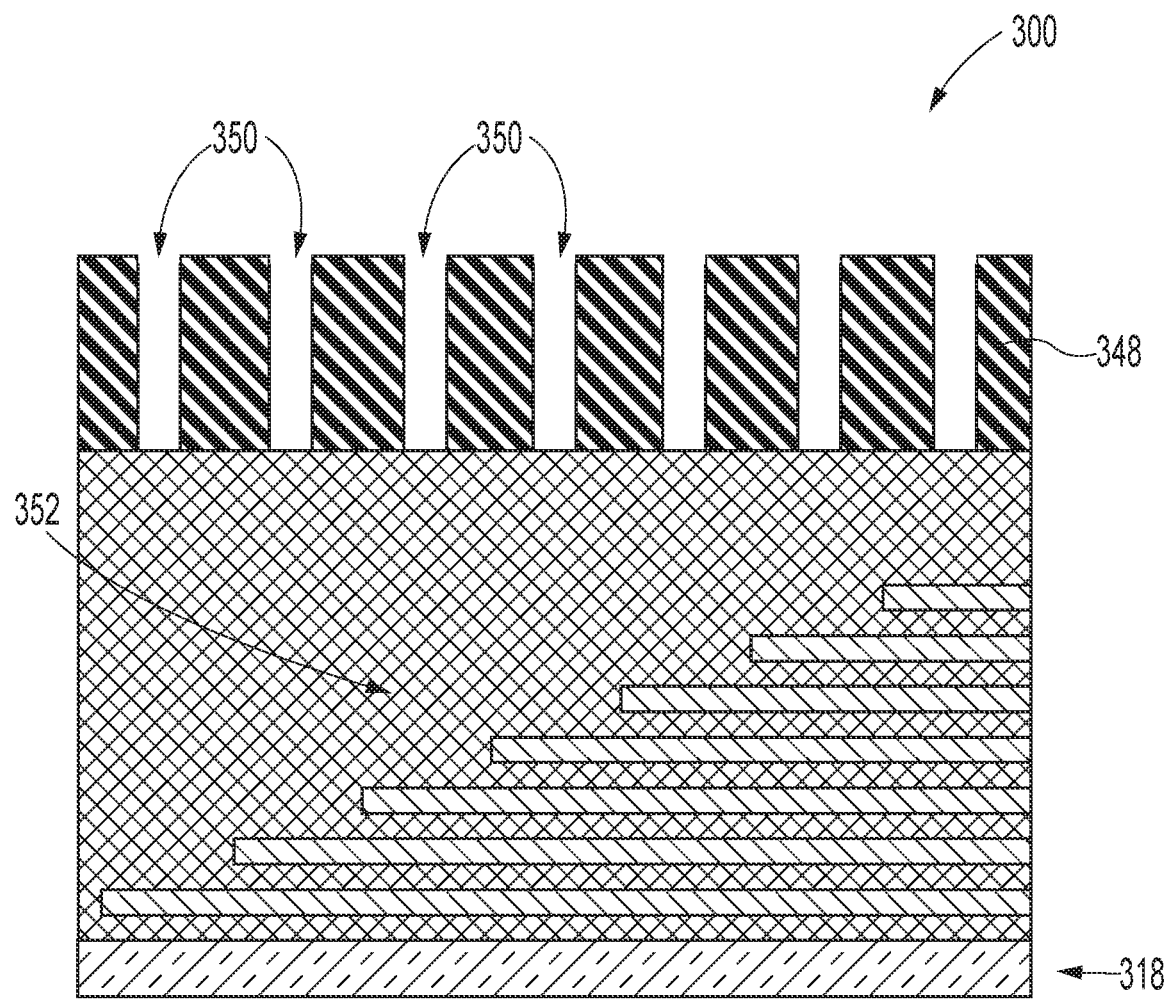

Collectively referring to FIGS. 24 and 25, a hard mask 348 may be formed over the stack structures 312 and over the slit openings 346. As shown in FIG. 25, openings 350 (e.g., apertures, through vias) may be formed in the hard mask 348 over the staircase structure 352.

Figure 26:
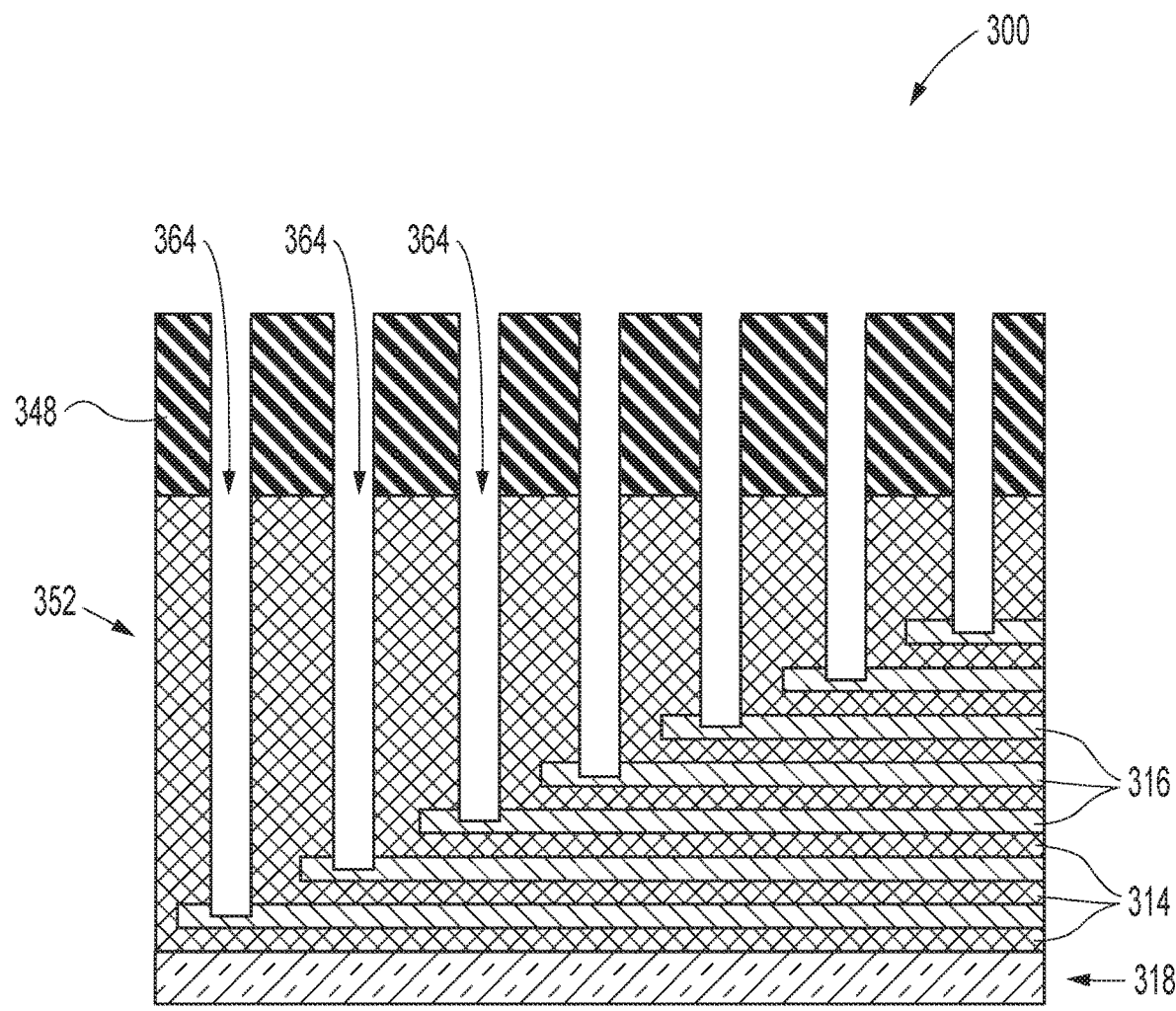

Referring next to FIG. 26, openings 364 may be formed in the staircase region, each opening 364 extending to a conductive structure 316 of the staircase structure 352. For example, an in-situ etch may be performed to create the openings 364 extending to the conductive structures 316 of the stack structure 312 at steps (corresponding to horizontal ends of the conductive structures 116) of the staircase structure 352 for the formation of the staircase contacts 342 (FIG. 22). While the openings 364 are formed, the hard mask 348 may cover and protect the slit openings 346.

Figure 27:
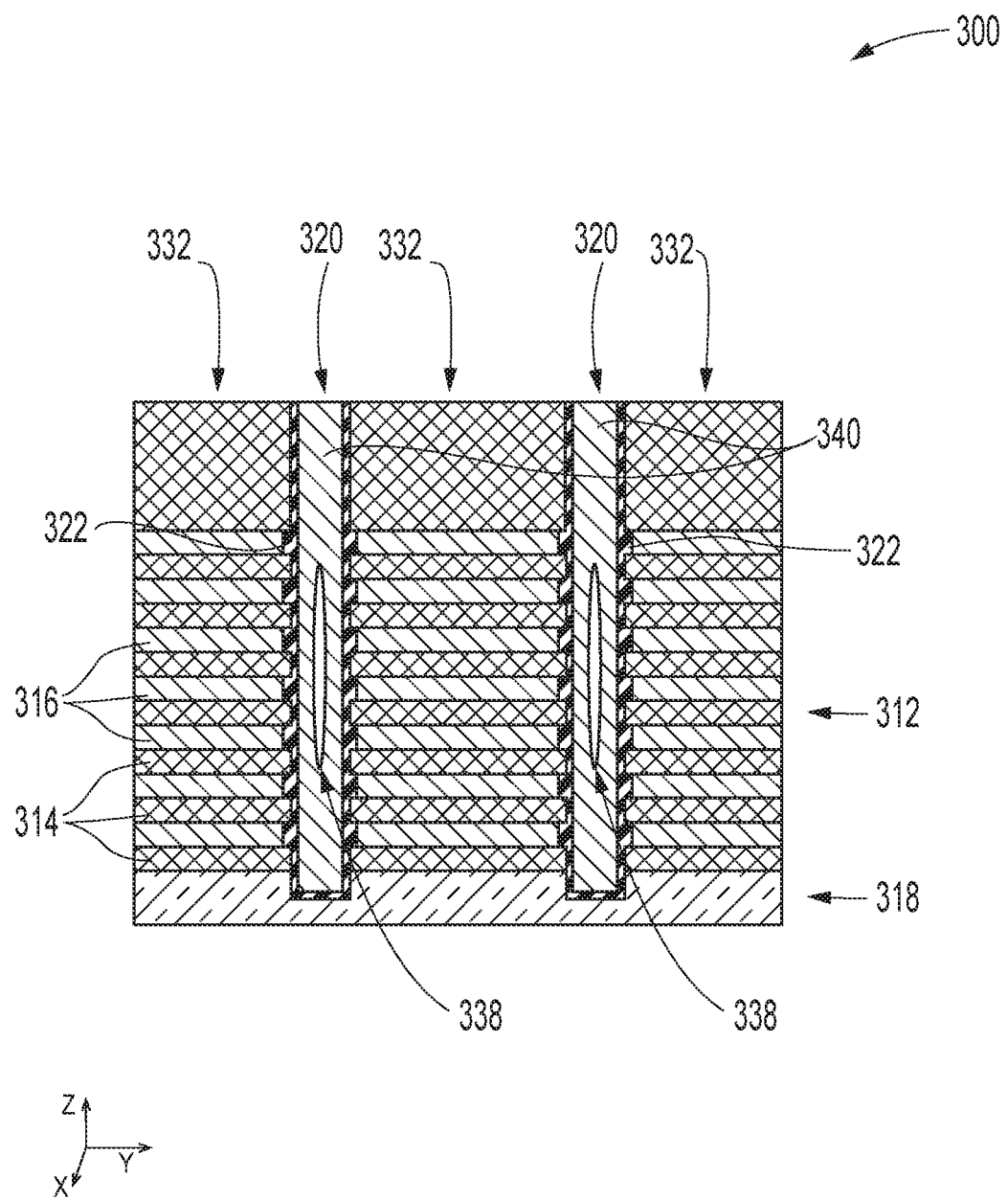

Referring next to FIG. 27, the hard mask 348 may be removed and one or more metal materials (e.g., one or more of titanium, titanium nitride, and tungsten) may be formed in the openings 362 to form the metal structures 340 (e.g., metal plugs).

Figure 28:
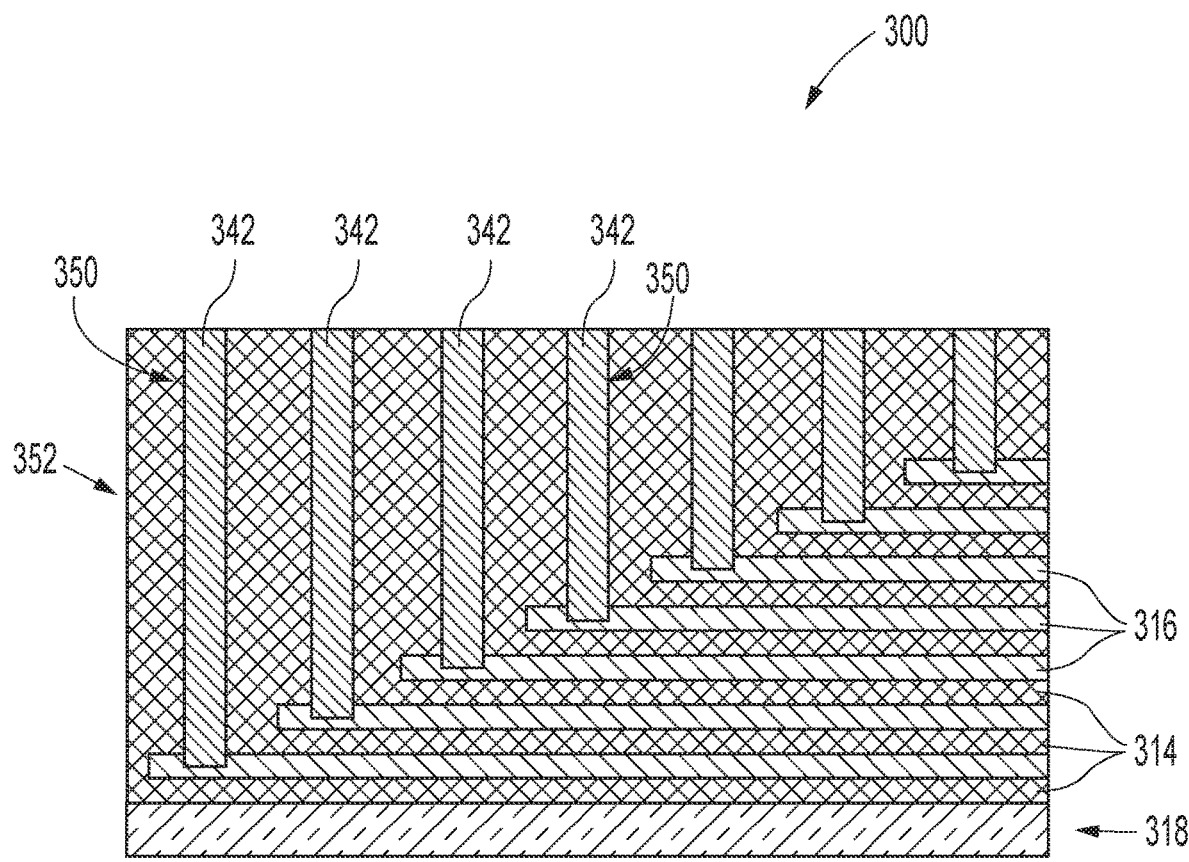

Referring next to FIG. 28, the staircase contacts 342 may be formed in the openings 350. The staircase contacts 342 may be formed simultaneously with the formation of the metal structures 340, and with the same metal materials as the metal structures 340. Additional structures, such as the insulative structure 334 (e.g., an oxide structure) and the bit lines 336 may then be formed over the stack structure 312 and slit structures 320 (FIG. 21).

Figure 29:
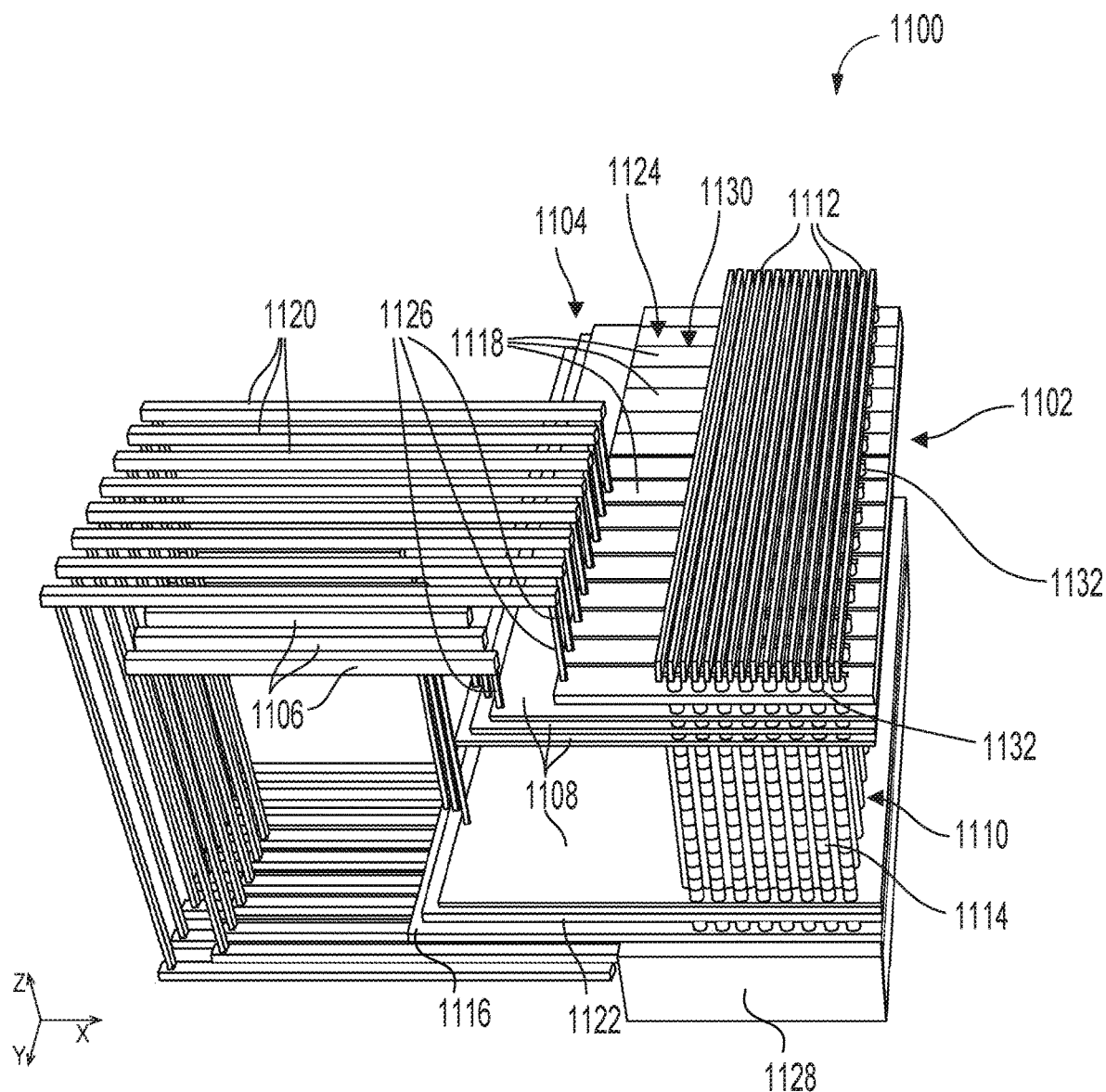
FIG. 29 is a partial, cutaway, perspective, schematic illustration of a microelectronic device, in accordance with embodiments of the disclosure.

FIG. 29 illustrates a partial cutaway, perspective, schematic illustration of a portion of a microelectronic device 1100 (e.g., a memory device, such as a 3D NAND Flash memory device) including a microelectronic device structure 1102. The microelectronic device structure 1102 may be substantially similar to the microelectronic device structure 100 of FIGS. 1 and 2, the microelectronic device structure 200 of FIGS. 12 and 13, and/or the microelectronic device structure 300 of FIGS. 21 and 22.

As illustrated in FIG. 29, the microelectronic device structure 1102 may further include at least one staircase structure 1104 (e.g., the staircase structure 152 (FIG. 2), the staircase structure 252 (FIG. 13), the staircase structure 352 (FIG. 22)) defining contact regions for connecting access lines 1106 to conductive structures 1108 (e.g., the conductive structures 116 (FIG. 1), the conductive structures 216 (FIG. 12), the conductive structures 316 (FIG. 21)).

The microelectronic device structure 1102 may also include vertical strings 1110 of memory cells 1114 coupled to each other in series. The memory cells 1114 may be formed at the intersections of the memory cell pillars and the conductive structures 1108. In some embodiments, the memory cells 1114 comprise so-called "MONOS" (metal-oxide-nitride-oxide-semiconductor) memory cells. In additional embodiments, the memory cells 1114 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 1114 comprise so-called "floating gate" memory cells including floating gates (e.g., metallic floating gates) as charge storage structures. The floating gates may horizontally intervene between central structures of the memory cell pillars and the conductive structures 1108. The vertical strings 1110 may extend vertically (e.g., in the Z-direction) and orthogonally relative to the conductive structures 1108, data lines 1112, a source tier 1116 (e.g., the source structure 118 below the stack structure 112 (FIG. 1), the source structure 218 below the stack structure 212 (FIG. 12), the source structure 318 below the stack structure 312 (FIG. 21)), the access lines 1106, first select gates 1118 (e.g., upper select gates, drain select gates (SGDs)), select lines 1120, and a second select gate 1122 (e.g., a lower select gate, a source select gate (SGS)). The first select gates 1118 may be provided within multiple blocks 1124 horizontally separated (e.g., in the Y-direction) from one another by slits 1130 (e.g., the slit structures 120 (FIG. 1), the slit structures 220 (FIG. 12), the slit structures 320 (FIG. 21)).

Vertical conductive contacts 1126 may electrically couple components to each other, as illustrated. For example, the select lines 1120 may be electrically coupled to the first select gates 1118 and the access lines 1106 may be electrically coupled to the conductive structures 1108. The microelectronic device 1100 may also include a control unit 1128 positioned under the memory array, which may include at least one of string driver circuitry, pass gates, circuitry for selecting gates, circuitry for selecting conductive lines (e.g., the data lines 1112, the access lines 1106), circuitry for amplifying signals, and circuitry for sensing signals. The control unit 1128 may be electrically coupled to the data lines 1112, the source tier 1116, the access lines 1106, the first select gates 1118, and the second select gates 1122, for example. In some embodiments, the control unit 1128 includes CMOS (complementary metal-oxide-semiconductor) circuitry. In such embodiments, the control unit 1128 may be characterized as having a "CMOS under Array" ("CuA") configuration.

The first select gates 1118 may extend horizontally in a first direction (e.g., the X-direction) and may be coupled to respective first groups of vertical strings 1110 of memory cells 1114 at a first end (e.g., an upper end) of the vertical strings 1110. The second select gate 1122 may be formed in a substantially planar configuration and may be coupled to the vertical strings 1110 at a second, opposite end (e.g., a lower end) of the vertical strings 1110 of memory cells 1114.

The data lines 1112 (e.g., bit lines) may extend horizontally in a second direction (e.g., in the Y-direction) that is at an angle (e.g., perpendicular) to the first direction in which the first select gates 1118 extend. The data lines 1112 may be coupled to respective second groups of the vertical strings 1110 at the first end (e.g., the upper end) of the vertical strings 1110. A first group of vertical strings 1110 coupled to a respective first select gate 1118 may share a particular vertical string 1110 with a second group of vertical strings 1110 coupled to a respective data line 1112. Thus, a particular vertical string 1110 may be selected at an intersection of a particular first select gate 1118 and a particular data line 1112. Accordingly, the first select gates 1118 may be used for selecting memory cells 1114 of the vertical strings 1110 of memory cells 1114.

The conductive structures 1108 (e.g., local word line plates) may extend in respective horizontal planes. The conductive structures 1108 may be stacked vertically, such that each conductive structure 1108 is coupled to all of the vertical strings 1110 of memory cells 1114, and the vertical strings 1110 of the memory cells 1114 extend vertically through the conductive structures 1108. The conductive structures 1108 may be coupled to or may form control gates of the memory cells 1114 to which the conductive structures 1108 are coupled. Each conductive structure 1108 may be coupled to one memory cell 1114 of a particular vertical string 1110 of memory cells 1114.

The first select gates 1118 and the second select gates 1122 may operate to select a particular vertical string 1110 of the memory cells 1114 between a particular data line 1112 and the source tier 1116. Thus, a particular memory cell 1114 may be selected and electrically coupled to a data line 1112 by operation of (e.g., by selecting) the appropriate first select gate 1118, second select gate 1122, and conductive structure 1108 that are coupled to the particular memory cell 1114.

The staircase structure 1104 may be configured to provide electrical connection between the access lines 1106 and the conductive structures 1108 through the vertical conductive contacts 1126. In other words, a particular level of the conductive structures 1108 may be selected via one of the access lines 1106 that is in electrical communication with a respective one of the conductive contacts 1126 in electrical communication with the particular conductive structure 1108.

The data lines 1112 may be electrically coupled to the vertical strings 1110 through conductive structures 1132.

Figure 30:
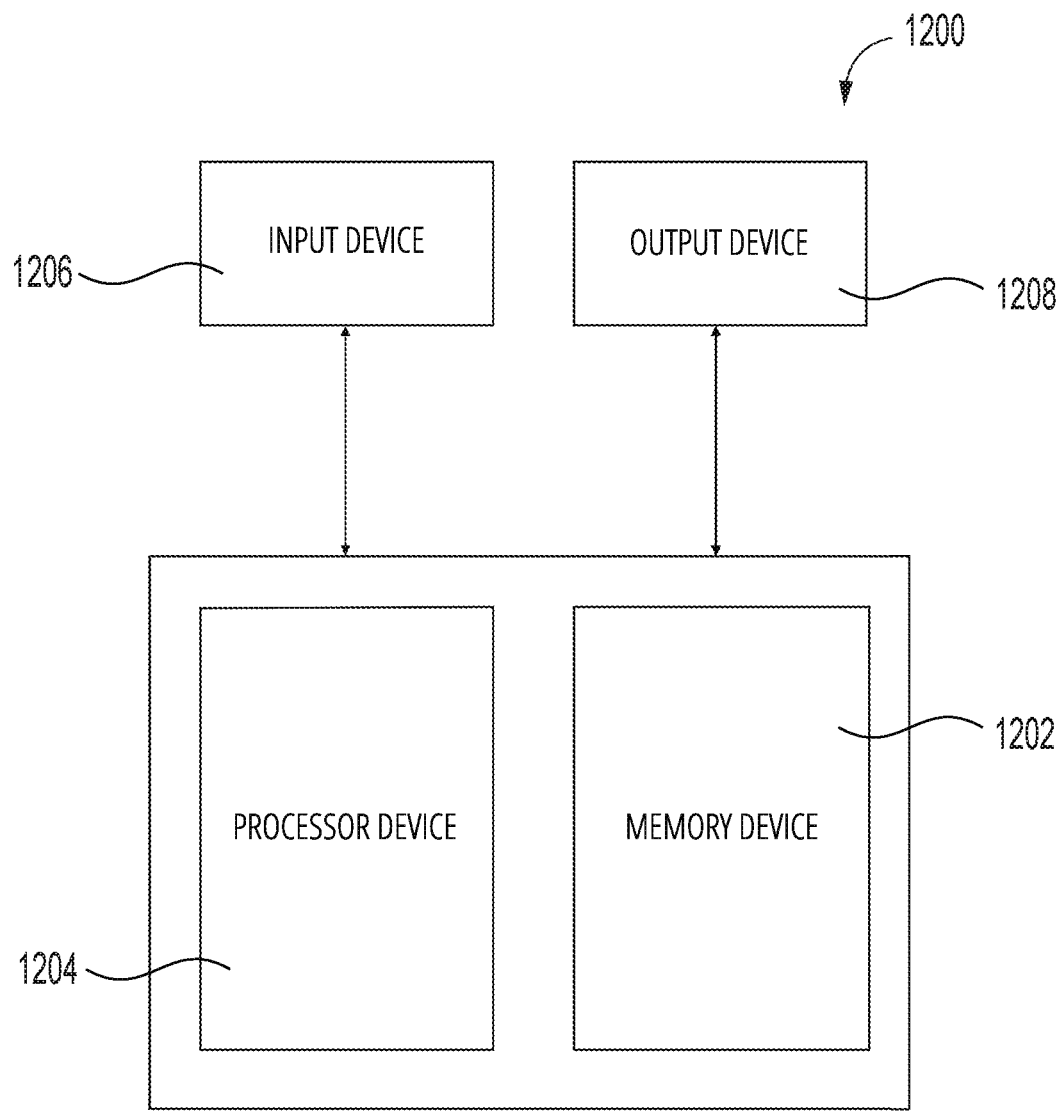
FIG. 30 is a block diagram of an electronic system, in accordance with embodiments of the disclosure.

Microelectronic devices (e.g., the microelectronic device 1100) including microelectronic device structures (such as the microelectronic device structure 100 (FIGS. 1 and 2), the microelectronic device structure 200 (FIGS. 12 and 13), the microelectronic device structure 300 (FIGS. 21 and 22)) of the disclosure may be used in embodiments of electronic systems of the disclosure. For example, FIG. 30 is a block diagram of an electronic system 1200, in accordance with embodiments of the disclosure. The electronic system 1200 may comprise, for example, a computer or computer hardware component, a server or other networking hardware component, a cellular telephone, a digital camera, a personal digital assistant (PDA), a portable media (e.g., music) player, a Wi-Fi or cellular-enabled tablet (e.g., an iPAD® or SURFACE® tablet, an electronic book, a navigation device), etc. The electronic system 1200 includes at least one memory device 1202. The memory device 1202 may include, for example, an embodiment of a microelectronic device and/or structure previously described herein (e.g., the microelectronic device structure 100 (FIGS. 1 and 2), the microelectronic device structure 200 (FIGS. 12 and 13), the microelectronic device structure 300 (FIGS. 21 and 22)), with structures formed according to methods of embodiments previously described herein. Accordingly, an electronic system is disclosed that may include an input device, an output device, and a processor device operably coupled to the input device and to the output device. The electronic system may further include a memory device operably coupled to the processor device and comprising at least one microelectronic device structure. The at least one microelectronic device structure may include a source structure, and a stack structure overlying the source structure. The stack structure may include a vertically alternating sequence of insulative structures and conductive structures. The at least one microelectronic device structure may further include slit structures vertically extending through the stack structure and dividing the stack structure into block portions. Each of the slit structures may include a dielectric liner in direct contact with the source structure, a semiconductive fill material partially circumscribed by the dielectric liner, and a metal plug partially circumscribed by the semiconductive fill material.

The electronic system 1200 may further include at least one electronic signal processor device 1204 (often referred to as a "microprocessor"). The processor device 1204 may, optionally, include an embodiment of a microelectronic device and/or a microelectronic device structure previously described herein (e.g., the microelectronic device structure 100 (FIGS. 1 and 2), the microelectronic device structure 200 (FIGS. 12 and 13), the microelectronic device structure 300 (FIGS. 21 and 22)). The electronic system 1200 may further include one or more input devices 1206 for inputting information into the electronic system 1200 by a user, such as, for example, a mouse or other pointing device, a keyboard, a touchpad, a button, or a control panel. The electronic system 1200 may further include one or more output devices 1208 for outputting information (e.g., visual or audio output) to a user such as, for example, a monitor, a display, a printer, an audio output jack, a speaker, etc. In some embodiments, the input device 1206 and the output device 1208 may comprise a single touchscreen device that can be used both to input information into the electronic system 1200 and to output visual information to a user. The input device 1206 and the output device 1208 may communicate electrically with one or more of the memory device 1202 and the electronic signal processor device 1204.

Figure 31:
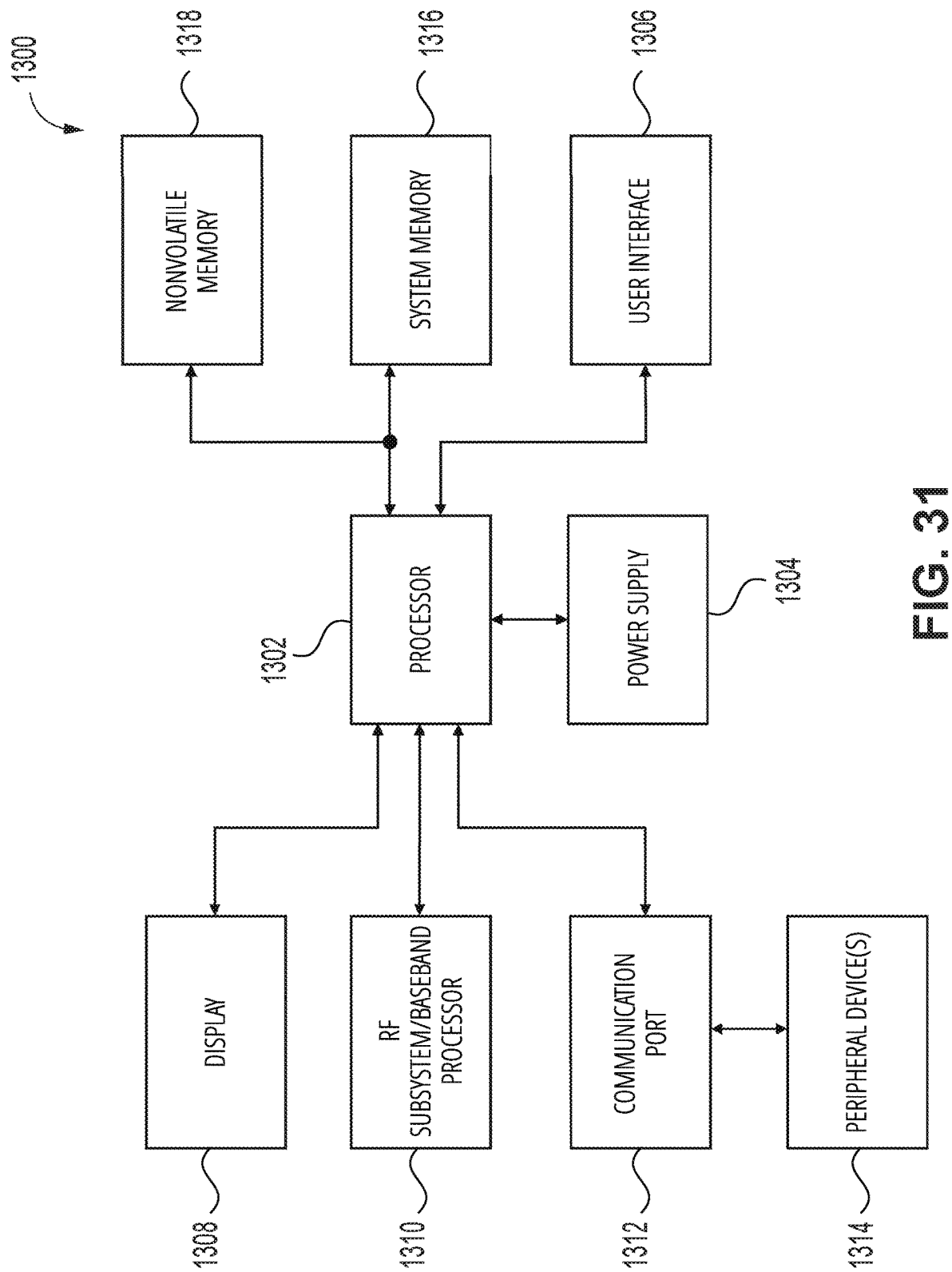
FIG. 31 is a block diagram of a processor-based system, in accordance with embodiments of the disclosure.

With reference to FIG. 31, shown is a block diagram of a processor-based system 1300. The processor-based system 1300 may include various microelectronic devices (e.g., the microelectronic device 1100 of FIG. 29) and microelectronic device structures (e.g., the microelectronic device structure 100 (FIGS. 1 and 2), the microelectronic device structure 200 (FIGS. 12 and 13), the microelectronic device structure 300 (FIGS. 21 and 22) manufactured in accordance with embodiments of the present disclosure. The processor-based system 1300 may be any of a variety of types, such as a computer, a pager, a cellular phone, a personal organizer, a control circuit, or another electronic device. The processor-based system 1300 may include one or more processors 1302, such as a microprocessor, to control the processing of system functions and requests in the processor-based system 1300. The processor 1302 and other subcomponents of the processor-based system 1300 may include microelectronic devices (e.g., the microelectronic device 1100 of FIG. 29) and microelectronic device structures (e.g., the microelectronic device structure 100 (FIGS. 1 and 2), the microelectronic device structure 200 (FIGS. 12 and 13), the microelectronic device structure 300 (FIGS. 21 and 22)) manufactured in accordance with embodiments of the present disclosure.

The processor-based system 1300 may include a power supply 1304 in operable communication with the processor 1302. For example, if the processor-based system 1300 is a portable system, the power supply 1304 may include one or more of a fuel cell, a power scavenging device, permanent batteries, replaceable batteries, and/or rechargeable batteries. The power supply 1304 may also include an AC adapter; therefore, the processor-based system 1300 may be plugged into a wall outlet, for example. The power supply 1304 may also include a DC adapter such that the processor-based system 1300 may be plugged into a vehicle cigarette lighter or a vehicle power port, for example.

Various other devices may be coupled to the processor 1302 depending on the functions that the processor-based system 1300 performs. For example, a user interface 1306 may be coupled to the processor 1302. The user interface 1306 may include one or more input devices, such as buttons, switches, a keyboard, a light pen, a mouse, a digitizer and stylus, a touch screen, a voice recognition system, a microphone, or a combination thereof. A display 1308 may also be coupled to the processor 1302. The display 1308 may include an LCD display, an SED display, a CRT display, a DLP display, a plasma display, an OLED display, an LED display, a three-dimensional projection, an audio display, or a combination thereof. Furthermore, an RF subsystem/baseband processor 1310 may also be coupled to the processor 1302. The RF subsystem/baseband processor 1310 may include an antenna that is coupled to an RF receiver and to an RF transmitter. A communication port 1312, or more than one communication port 1312, may also be coupled to the processor 1302. The communication port 1312 may be adapted to be coupled to one or more peripheral devices 1314 (e.g., a modem, a printer, a computer, a scanner, a camera) and/or to a network (e.g., a local area network (LAN), a remote area network, an intranet, or the Internet).

The processor 1302 may control the processor-based system 1300 by implementing software programs stored in the memory (e.g., system memory 1316). The software programs may include an operating system, database software, drafting software, word processing software, media editing software, and/or media-playing software, for example. The memory (e.g., the system memory 1316) is operably coupled to the processor 1302 to store and facilitate execution of various programs. For example, the processor 1302 may be coupled to system memory 1316, which may include one or more of spin torque transfer magnetic random access memory (STT-MRAM), magnetic random access memory (MRAM), dynamic random access memory (DRAM), static random access memory (SRAM), racetrack memory, and/or other known memory types. The system memory 1316 may include volatile memory, nonvolatile memory, or a combination thereof. The system memory 1316 is typically large so it can store dynamically loaded applications and data. In some embodiments, the system memory 1316 may include semiconductor devices (e.g., the microelectronic device 1100 of FIG. 30) and structures (e.g., the microelectronic device structure 100 (FIGS. 1 and 2), the microelectronic device structure 200 (FIGS. 12 and 13), the microelectronic device structure 300 (FIGS. 21 and 22)) described above, or a combination thereof.

The processor 1302 may also be coupled to nonvolatile memory 1318, which is not to suggest that system memory 1316 is necessarily volatile. The nonvolatile memory 1318 may include one or more of STT-MRAM, MRAM, read-only memory (ROM) (e.g., EPROM, resistive read-only memory (RROM)), and Flash memory to be used in conjunction with the system memory 1316. The size of the nonvolatile memory 1318 is typically selected to be just large enough to store any necessary operating system, application programs, and fixed data. Additionally, the nonvolatile memory 1318 may include a high-capacity memory (e.g., disk drive memory, such as a hybrid-drive including resistive memory or other types of nonvolatile solid-state memory, for example). The nonvolatile memory 1318 may include microelectronic devices (e.g., the microelectronic device 1100 of FIG. 29) and structures (e.g., the microelectronic device structure 100 (FIGS. 1 and 2), the microelectronic device structure 200 (FIGS. 12 and 13), the microelectronic device structure 300 (FIGS. 21 and 22)) described above.

While the disclosed structures, apparatus (e.g., devices), systems, and methods are susceptible to various modifications and alternative forms in implementation thereof, specific embodiments have been shown by way of example in the drawings and have been described in detail herein. However, the disclosure is not intended to be limited to the particular forms disclosed. Rather, the disclosure encompasses all modifications, combinations, equivalents, variations, and alternatives falling within the scope of the disclosure as defined by the following appended claims and their legal equivalents.

What is claimed is:

1. A microelectronic device, comprising:
a stack structure comprising a vertically alternating sequence of insulative structures and conductive structures, the stack structure divided into block portions;
a conductive source structure vertically underlying the stack structure;
slit structures horizontally interposed between the block portions of the stack structure, each of the slit structures comprising:
a metal structure comprising:
an upper portion comprising metal material overlying an upper boundary of the stack structure, an upper boundary of the upper portion completely covered with an insulating structure; and
a lower portion integral and continuous with the upper portion and comprising the metal material vertically extending through at least a majority of the stack structure,
a center of the metal material of the lower portion substantially aligned with a center of the metal material of the upper portion in a first horizontal direction, and
the metal material of the lower portion having a smaller width in the first horizontal direction than metal material of the upper portion; and
a polysilicon fill material directly on and substantially covering side surfaces and a lowermost surface of the metal structure;
a dielectric liner directly on and substantially covering side surfaces and a lowermost surface of the polysilicon fill material, the dielectric liner interposed between and substantially electrically isolating the polysilicon fill material from each of the conductive source structure and the conductive structures of the stack;
wherein the metal material of the upper portion and the lower portion of the metal structure of each of the slit structures comprises tungsten; and
wherein the one or more of the slit structures further comprises a void underlying the metal structure and surrounded by the polysilicon fill material.

2. The microelectronic device of claim 1, further comprising conductive contacts extending to at least some of the conductive structures of the stack structure at steps of a staircase comprising horizontal ends of the conductive structures, the conductive contacts having substantially the same material composition as the upper portion and the lower portion of the metal structure of each of the slit structures.

3. The microelectronic device of claim 1, wherein the dielectric liner of at least one of the slit structures comprises a dielectric oxide.

4. The microelectronic device of claim 1, where an aspect ratio of each of the slit structures is greater than or equal to about 40 to 1.

5. The microelectronic device of claim 1, wherein each of the slit structures is interposed between two of the block portions of the stack structure in the first horizontal direction and has a horizontally elongate shape extending in a second horizontal direction orthogonal to the first horizontal direction.

6. The microelectronic device of claim 1, wherein:
sidewalls of the metal material of the upper portion of the metal structure of each of the slit structures vertically extend in substantially linear paths; and
sidewalls of the metal material of the lower portion of the metal structure of each of the slit structures vertically extend in at least partially arcuate paths.

7. A microelectronic device, comprising:
a stack structure comprising conductive structures vertically interleaved with insulative structures, the stack structure having at least one staircase structure therein comprising horizontal ends of the conductive structures; and
slit structures vertically extending through the stack structure and each having an aspect ratio greater than or equal to about 40 to 1, each of the slit structures comprising:
a horizontally elongate metal structure extending in a first horizontal direction and comprising:
an upper portion comprising metal material, an upper boundary of the upper portion completely covered with an insulating structure; and
a lower portion integral and continuous with the upper portion and comprising the metal material vertically extending through at least a majority of the stack structure,
the metal material of the lower portion centered about the metal material of the upper portion in a second horizontal direction orthogonal to the first horizontal direction, and
the metal material of the lower portion having a smaller width in the second horizontal direction than the metal material of the upper portion;
a semiconductive fill material directly on and substantially covering each of:
sidewalls of the metal material of the upper portion and the lower portion of the horizontally elongate metal structure; and
a lowermost surface of the metal material of the lower portion of the horizontally elongate metal structure;
a dielectric liner substantially continuously extending across and completely covering outer sidewalls and a lowermost surface of the semiconductive fill material, the dielectric liner electrically isolating the semiconductive fill material from conductive source material vertically thereunder;
wherein the metal material of the upper portion and the lower portion of the horizontally elongate metal structure of each of the slit structures comprises tungsten; and
wherein at least one of the slit structures further comprises a void space underlying the horizontally elongate metal structure and surrounded by the semiconductive fill material.

8. The microelectronic device of claim 7, wherein the lower portion of the horizontally elongate metal structure of each of the slit structures only partially vertically extends through the stack structure.

9. The microelectronic device of claim 7, wherein the semiconductive fill material comprises polysilicon.

* * * * *